US012112390B2

(12) United States Patent
Fife

(10) Patent No.: US 12,112,390 B2
(45) Date of Patent: *Oct. 8, 2024

(54) DEMAND SETPOINT MANAGEMENT IN ELECTRICAL SYSTEM CONTROL AND RELATED SYSTEMS, APPARATUSES, AND METHODS

(71) Applicant: Enel X North America, Inc., Boston, MA (US)

(72) Inventor: John Michael Fife, Bend, OR (US)

(73) Assignee: Enel X North America, Inc., Boston, MA (US)

( * ) Notice: Subject to any disclaimer, the term of this patent is extended or adjusted under 35 U.S.C. 154(b) by 9 days.

This patent is subject to a terminal disclaimer.

(21) Appl. No.: 17/400,891

(22) Filed: Aug. 12, 2021

(65) Prior Publication Data

US 2022/0209535 A1 Jun. 30, 2022

Related U.S. Application Data

(63) Continuation of application No. 16/203,339, filed on Nov. 28, 2018, now Pat. No. 11,121,552.

(60) Provisional application No. 62/693,323, filed on Jul. 2, 2018.

(51) Int. Cl.
*G06Q 50/06* (2024.01)
*G01R 21/00* (2006.01)
*H02J 3/28* (2006.01)
*H02J 3/00* (2006.01)

(52) U.S. Cl.
CPC .......... *G06Q 50/06* (2013.01); *G01R 21/006* (2013.01); *H02J 3/28* (2013.01); *H02J 3/003* (2020.01); *H02J 2203/10* (2020.01)

(58) Field of Classification Search
CPC .......... G06Q 50/06; G01R 21/006; H02J 3/28; H02J 3/003; H02J 2203/10; Y04S 10/50
USPC .................................................. 700/291, 295
See application file for complete search history.

(56) References Cited

U.S. PATENT DOCUMENTS

| | | | |
|---|---|---|---|
| 4,141,069 A | 2/1979 | Fox | |
| 4,167,679 A | 9/1979 | Leyde et al. | |
| 4,475,685 A | 10/1984 | Grimado et al. | |
| 4,731,547 A | 3/1988 | Alenduff et al. | |
| 4,819,180 A * | 4/1989 | Hedman | H02J 13/00002 700/291 |
| 5,873,251 A | 2/1999 | Iino | |
| 7,797,062 B2 | 9/2010 | Discenzo et al. | |
| 7,839,017 B2 | 11/2010 | Huizenga et al. | |

(Continued)

OTHER PUBLICATIONS

FIFE , Notice of Allowance dated May 12, 2021 for U.S. Appl. No. 16/203,339.

(Continued)

*Primary Examiner* — Thomas C Lee
*Assistant Examiner* — Michael Tang
(74) *Attorney, Agent, or Firm* — Foley & Lardner LLP

(57) ABSTRACT

The present disclosure is directed to systems and methods for controlling an electrical system using setpoints. Some embodiments include control methods that monitor an adjusted net power associated with the electrical system and adjust the setpoint based on a comparison of the adjusted demand to the setpoint. If the adjusted demand has not exceeded the demand setpoint, the setpoint is reduced. If the adjusted demand has exceeded the demand setpoint, the setpoint is increased.

20 Claims, 9 Drawing Sheets

(56) References Cited

U.S. PATENT DOCUMENTS

| | | | |
|---|---|---|---|
| 8,019,445 B2 | 9/2011 | Marhoefer | |
| 8,019,697 B2 | 9/2011 | Ozog | |
| 8,600,571 B2 | 12/2013 | Dillon et al. | |
| 8,886,361 B1 | 11/2014 | Harmon et al. | |
| 9,020,800 B2 | 4/2015 | Shelton et al. | |
| 9,436,179 B1 | 9/2016 | Turney et al. | |
| 9,865,024 B2 | 1/2018 | Mokhtari et al. | |
| 2005/0065674 A1 | 3/2005 | Houpt et al. | |
| 2009/0048716 A1 | 2/2009 | Marhoefer | |
| 2009/0063257 A1* | 3/2009 | Zak | G06Q 30/0202 700/286 |
| 2009/0319090 A1 | 12/2009 | Dillon et al. | |
| 2010/0174643 A1 | 7/2010 | Schaefer et al. | |
| 2010/0179704 A1 | 7/2010 | Ozog | |
| 2010/0198421 A1 | 8/2010 | Fahimi et al. | |
| 2011/0071695 A1 | 3/2011 | Kouroussis et al. | |
| 2011/0106328 A1 | 5/2011 | Zhou et al. | |
| 2011/0218691 A1* | 9/2011 | O'Callaghan | G06Q 10/06 700/295 |
| 2012/0109390 A1 | 5/2012 | Delong et al. | |
| 2012/0296482 A1 | 11/2012 | Steven et al. | |
| 2012/0302092 A1 | 11/2012 | Kaps et al. | |
| 2012/0319642 A1 | 12/2012 | Suyama et al. | |
| 2012/0323389 A1 | 12/2012 | Shelton et al. | |
| 2013/0013121 A1 | 1/2013 | Henze et al. | |
| 2013/0030590 A1 | 1/2013 | Prosser | |
| 2013/0079939 A1 | 3/2013 | Darden, II et al. | |
| 2013/0085616 A1 | 4/2013 | Wenzel | |
| 2013/0166081 A1 | 6/2013 | Sanders et al. | |
| 2013/0166084 A1 | 6/2013 | Sedighy et al. | |
| 2013/0166234 A1 | 6/2013 | Chou et al. | |
| 2013/0190939 A1* | 7/2013 | Lenox | H02J 3/32 700/291 |
| 2013/0226358 A1 | 8/2013 | Rudkevich et al. | |
| 2013/0226637 A1 | 8/2013 | Bozchalui et al. | |
| 2013/0261817 A1 | 10/2013 | Detmers et al. | |
| 2013/0261823 A1 | 10/2013 | Krok et al. | |
| 2013/0274935 A1 | 10/2013 | Deshpande et al. | |
| 2013/0346139 A1 | 12/2013 | Steven et al. | |
| 2014/0039965 A1 | 2/2014 | Steven et al. | |
| 2014/0058572 A1 | 2/2014 | Stein et al. | |
| 2014/0167705 A1 | 6/2014 | Chang et al. | |
| 2014/0236369 A1 | 8/2014 | Kearns et al. | |
| 2014/0266054 A1* | 9/2014 | Faries | H02J 3/32 320/128 |
| 2014/0277797 A1 | 9/2014 | Mokhtari et al. | |
| 2014/0350743 A1 | 11/2014 | Asghari et al. | |
| 2014/0365022 A1 | 12/2014 | Ghosh et al. | |
| 2015/0127425 A1 | 5/2015 | Greene et al. | |
| 2015/0268307 A1 | 9/2015 | Inguva et al. | |
| 2015/0355655 A1 | 12/2015 | Wang et al. | |
| 2016/0011274 A1 | 1/2016 | Morita et al. | |
| 2016/0041575 A1 | 2/2016 | Tadano | |
| 2016/0047862 A1 | 2/2016 | Shimizu et al. | |
| 2016/0274653 A1* | 9/2016 | Mydlil | G06F 1/3296 |
| 2016/0377686 A1 | 12/2016 | Uchida et al. | |
| 2017/0099056 A1 | 4/2017 | Vickery et al. | |
| 2017/0104343 A1* | 4/2017 | ElBsat | H02J 3/388 |
| 2017/0285111 A1 | 10/2017 | Fife | |
| 2017/0285587 A1 | 10/2017 | Fife | |
| 2017/0285678 A1 | 10/2017 | Fife | |
| 2017/0286882 A1 | 10/2017 | Fife | |
| 2017/0317528 A1 | 11/2017 | Fife | |
| 2018/0258736 A1 | 9/2018 | Urdaneta | |
| 2019/0042992 A1 | 2/2019 | Fife | |
| 2020/0006940 A1 | 1/2020 | Fife | |

OTHER PUBLICATIONS

FIFE, Office Action dated Aug. 12, 2020 for U.S. Appl. No. 16/203,339.

FIFE, Office Action dated Dec. 3, 2020 for U.S. Appl. No. 16/203,339.

FIFE, Office Action dated Mar. 5, 2020 for U.S. Appl. No. 16/203,339.

\* cited by examiner

DEMAND SETPOINT MANAGEMENT IN ELECTRICAL SYSTEM CONTROL AND RELATED SYSTEMS, APPARATUSES, AND METHODS

RELATED APPLICATIONS

This application is a continuation of U.S. patent application Ser. No. 16/203,339 titled "DEMAND SETPOINT MANAGEMENT IN ELECTRICAL SYSTEM CONTROL, AND RELATED SYSTEMS APPARATUSES, AND METHODS," filed Nov. 28, 2018, which claims priority to U.S. Provisional Patent Application No. 62/693,323, titled "DEMAND SETPOINT MANAGEMENT IN ELECTRICAL SYSTEM CONTROL, AND RELATED SYSTEMS APPARATUSES, AND METHODS," filed Jul. 2, 2018, each of which is hereby incorporated herein by reference to the extent such subject matter is not inconsistent herewith.

TECHNICAL FIELD

The present disclosure is directed to systems and methods for control of an electrical system, and more particularly to controllers and methods of controllers for controlling an electrical system.

BACKGROUND

Electricity supply and delivery costs continue to rise, especially in remote or congested areas. Moreover, load centers (e.g., population centers where electricity is consumed) increasingly demand more electricity. In the U.S. energy infrastructure is such that power is mostly produced by resources inland, and consumption of power is increasing at load centers along the coasts. Thus, transmission and distribution (T&D) systems are needed to move the power from where it is generated to where it is consumed at the load centers. As the load centers demand more electricity, additional T&D systems are needed, particularly to satisfy peak demand. However, a major reason construction of additional T&D systems is unwise and/or undesirable is because full utilization of this infrastructure is really only necessary during relatively few peak demand periods, and would otherwise be unutilized or underutilized. Justifying the significant costs of constructing additional T&D resources may make little sense when actual utilization may be relatively infrequent.

Distributed energy storage is increasingly seen as a viable means for minimizing rising costs by storing electricity at the load centers for use during the peak demand times. An energy storage system (ESS) can enable a consumer of energy to reduce or otherwise control a net consumption from an energy supplier. For example, if electricity supply and/or delivery costs are high at a particular time of day, an ESS, which may include one or more batteries or other storage devices, can generate/discharge electrical energy at that time when costs are high in order to reduce the net consumption from the supplier. Likewise, when electricity rates are low, the ESS may charge so as to have reserve energy to be utilized in a later scenario as above when supply and/or delivery costs are high.

An automatic controller may be beneficial to reduce costs of operation of an electrical system during peak demand times.

BRIEF DESCRIPTION OF THE DRAWINGS

Additional aspects and advantages will be apparent from the following detailed description of preferred embodiments, which proceeds with reference to the accompanying drawings, in which.

DETAILED DESCRIPTION

Figure 1:
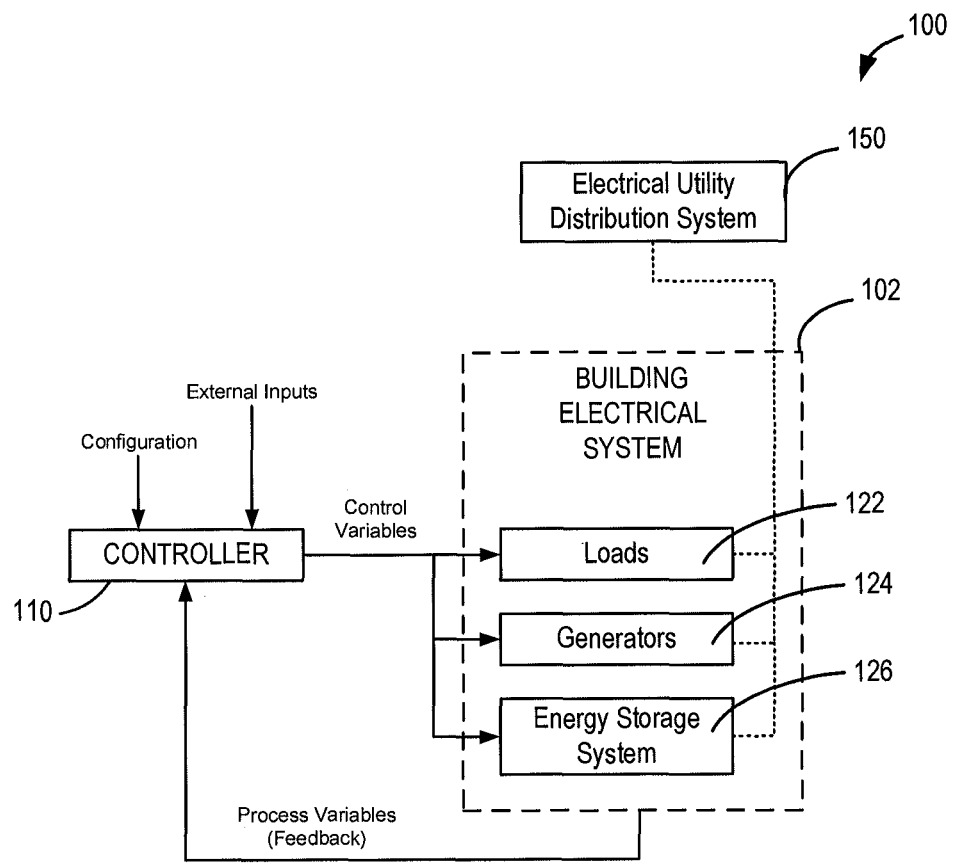
FIG. 1 is a block diagram illustrating a system architecture of a controllable electrical system, according to one embodiment of the present disclosure.

As electricity supply and delivery costs increase, especially in remote or congested areas, distributed energy storage is increasingly seen as a viable means for reducing those costs. An energy storage system (ESS) gives a local generator or consumer the ability to control net consumption and delivery of electrical energy at a point of interconnection. For example, if electricity supply and/or delivery costs (e.g., charges) are high at a particular time of day, an ESS can generate/discharge electrical energy from a storage system at that time to reduce the net consumption of a consumer (e.g., a building), and thus reduce costs to the consumer. Likewise, when electricity rates are low, the ESS may charge its storage system which may include one or more batteries or other storage devices. The lower-cost energy stored in the ESS can then be used to reduce net consumption and thus costs to the consumer at times when the supply and/or delivery costs are high.

One possible way in which ESSs can provide value is by reducing demand charges. Demand charges are electric utility charges that are based on the rate of electrical energy consumption (also referred to as "demand") during particular time windows (which may be referred to herein as "demand windows"). A precise definition of demand and the formula for demand charges may be defined in a utility's tariff document. For example, a tariff may specify that demand be calculated at given demand intervals (e.g., 15-minute intervals, 30-minute intervals, 40-minute intervals, 60-minute intervals, 120-minute intervals, etc.). The tariff may also define demand as being the average rate of electrical energy consumption over a previous period of time (e.g., the previous 15 minutes, 30 minutes, 40 minutes, etc.). In some embodiments, the tariff may specify that the demand be calculated instantaneously. The previous period of time may or may not coincide with the demand interval.

Demand may be expressed in units of power such as kilowatts (kW) or megawatts (MW). The tariff may describe one or more demand rates, each with an associated demand window (e.g., a period of time during which a demand rate applies). The demand windows may be contiguous or non-contiguous and may span days, months, or any other total time interval per the tariff. Also, one or more demand windows may overlap which means that, at a given time, more than one demand rate may be applicable.

Demand charges for each demand window may be calculated as a demand rate multiplied by the maximum demand during the associated demand window. Demand rates in the United States may be expressed in dollars per peak demand ($/kW). As can be appreciated, demand tariffs may change from time to time, or otherwise vary, for example annually, seasonally, monthly, or daily. An automatic controller may be beneficial and may be desirable to enable intelligent actions to be taken as frequently as may be needed to utilize an ESS to reduce demand charges. As can be appreciated, an automatic controller that can automatically operate an electrical system to reduce demand charges using an ESS may be desirable and beneficial.

For example, the controller may attempt to reduce maximum demand during the associated demand window to reduce demand charges. To do this the controller may initialize a demand setpoint representing a desired upper limit of net consumption of power from a utility distribution system during the demand window. If the demand window is known and the net consumption exceeds the demand setpoint, some controllers may increase the demand setpoint to a peak of the net consumption during the demand window (since the demand charge is based on the peak demand), then decrease the setpoint when a new demand window begins.

However, the beginning and ending of the demand window may be unknown. For example, some utilities use human meter readers that inherently cannot read every meter at the same time. Meter readers may even be days late to read a meter. Thus, because the demand window timing may be based on when a meter is read, it can be difficult to know when a demand window ends and a new demand window begins.

Disclosed herein are embodiments that continuously or periodically adjust a setpoint rather than trying to determine when the demand charge is reset. If the net consumption exceeds the demand setpoint, the demand setpoint may be increased by a predetermined amount. If the net consumption does not exceed the demand setpoint or independent of whether the net consumption exceeds the demand setpoint, the demand setpoint may be decreased by a predetermined amount.

Controlling Electrical Systems

An electrical system, according to some embodiments, may include one or more electrical loads, generators, and ESSs. An electrical system may include all three of these components (loads, generators, ESSs), or may have varying numbers and combinations of these components. For example, an electrical system may have loads and an ESS, but no local generators (e.g., photovoltaic, wind, combustion, fuel cell). The electrical system may or may not be connected to an electrical utility distribution system (or "grid").

An ESS of an electrical system may include one or more storage devices and any number of power conversion devices. The power conversion devices are able to transfer energy between an energy storage device and the main electrical power connections that in turn connect to the electrical system loads and, in some embodiments, to the grid. The energy storage devices may be different in different implementations of the ESS. A battery is a familiar example of a chemical energy storage device. For example, in one embodiment of the present disclosure, one or more electric vehicle batteries is connected to an electrical system and can be used to store energy for later use by the electrical system. A flywheel is an example of a mechanical energy storage device.

FIG. 1 is a control diagram of an electrical system 100, according to one embodiment of the present disclosure. Stated otherwise, FIG. 1 is a representative diagram of a system architecture of an electrical system 100 including a controller 110, according to one embodiment. The electrical system 100 comprises a building electrical system 102 that is controlled by the controller 110. The building electrical system 102 includes one or more loads 122, one or more generators 124, and an energy storage system (ESS) 126. The building electrical system 102 is coupled to an electrical utility distribution system 150, and therefore may be considered on-grid.

The controller 110 uses one or more setpoints to control the consumption of electrical energy by the building electrical system 102. The controller may continuously or periodically adjust the one or more demand setpoints to reduce power consumption during demand windows. By continuously or periodically adjusting the setpoint, the controller 110 may optimize the use of energy by the building electrical system 102 by maintaining a low average setpoint. Having a low average setpoint may cause the setpoint to be low during a demand window, regardless of knowledge of the demand window beginning and ending, thereby lowering the demand charge.

Continuously adjusting the demand setpoint is used herein to signify that the demand setpoint is adjusted continually or in an ongoing manner, such as every optimization cycle or evaluation of inputs to produce a parameter set.

For a controller to adjust the setpoint periodically, the controller may adjust the setpoint based on time. For example, the controller may adjust the setpoint every minute, every hour, or daily by a small amount. For instance, the controller may adjust the demand setpoint at midnight.

In the control diagram of FIG. 1, the controller 110 is shown on the left-hand side and the building electrical system 102, sometimes called the "plant," is on the right-hand side. The controller 110 may include electronic hardware and software in one embodiment. In one example arrangement, the controller 110 includes one or more processors and suitable storage media, which store programming in the form of executable instructions which are executed by the processors to implement the control processes. In some embodiments, the building electrical system 102 is the combination of all local loads 122, local generators 124, and the ESS 126.

Loads are consumers of electrical energy within an electrical system. Examples of loads are air conditioning systems, motors, electric heaters, etc. The sum of the loads' electricity consumption rates can be measured in units of power (e.g., kW) and simply called "load" (e.g., a building load).

Generators may be devices, apparatuses, or other means for generating electrical energy within an electrical system. Examples are solar photovoltaic systems, wind generators, fuel cells, combined heat and power (CHP) systems, and diesel generators or "gen-sets." The sum of electric energy generation rates of the generators 124 can be measured in units of power (e.g., kW) and simply referred to as "generation."

As can be appreciated, loads may also generate at certain times. An example may be an elevator system that is capable of regenerative operation when the carriage travels down.

Unadjusted net power may refer herein to load minus generation in the absence of active control by a controller described herein. For example, if at a given moment a building has loads consuming 100 kW, and a solar photovoltaic system generating at 25 kW, the unadjusted net power is 75 kW. Similarly, if at a given moment a building has loads consuming 70 kW, and a solar photovoltaic system generating at 100 kW, the unadjusted net power is −30 kW. As a result, the unadjusted net power is positive when the load energy consumption exceeds generation and negative when the generation exceeds the load energy consumption.

ESS power refers herein to a sum of a rate of electric energy consumption of an ESS. If ESS power is positive, an ESS is charging (consuming energy). If ESS power is negative, an ESS is generating (delivering energy).

Adjusted net power refers herein to unadjusted net power plus the power contribution of any controllable elements such as an ESS. Adjusted net power is therefore the net rate of consumption of electrical energy of the electrical system considering all loads, generators, and ESSs in the system, as controlled by a controller described herein.

Unadjusted demand is demand defined by the locally applicable tariff, but only based on the unadjusted net power. In other words, unadjusted demand does not consider the contribution of any ESS.

Adjusted demand or simply "demand" is demand as defined by the locally applicable tariff, based on the adjusted net power, which includes the contribution from any and all controllable elements such as ESSs. Adjusted demand is the demand that can be monitored by the utility and used in the demand charge calculation.

Referring again to FIG. 1, the building electrical system 102 may provide information to the controller 110, such as in a form of providing process variables. The process variables may provide information, or feedback, as to a status of the building electrical system 102 and/or one or more components (e.g., loads, generators, ESSs) therein. For example, the process variable may provide one or more measurements of a state of the building electrical system 102.

The controller 110 receives the process variables for determining values for control variables to be communicated to the building electrical system 102 to effectuate a change to the building electrical system 102 toward meeting a controller objective for the building electrical system 102. For example, the controller 110 may provide a control variable to adjust the load 122, to increase or decrease generation by the generator 124, and to utilize (e.g., charge or discharge) the ESS 126. The controller 110 may also receive a configuration (e.g., a set of configuration elements), which may specify one or more constraints of the electrical system 102. The controller 110 may also receive external inputs (e.g., weather reports, changing tariffs, fuel costs, event data), which may inform the determination of the values of the control variables. A set of external inputs may be received by the controller 110. The set of external inputs may provide indication of one or more conditions that are external to the controller and the electrical system.

As noted, the controller 110 may attempt to meet certain objectives by changing a value associated with one or more control variables, if necessary. The objectives may be predefined, and may also be dependent on time, on any external inputs, on any process variables that are obtained from the building electrical system 102, and/or on the control variables themselves. Some examples of controller objectives for different applications are:
  Minimize demand (kW) over a prescribed time interval;
  Minimize demand charges ($) over a prescribed time interval;
  Minimize total electricity charges ($) from the grid;
  Reduce demand (kW) from the grid by a prescribed amount during a prescribed time window; and
  Maximize the life of the energy storage device.

Objectives can also be compound—that is, a controller objective can comprise multiple individual objectives. One example of a compound objective is to minimize demand charges while maximizing the life of the energy storage device. Other compound objectives including different combinations of the individual objectives are possible.

The inputs that the controller 110 may use to determine (or otherwise inform a determination of) the control variables can include configuration, external inputs, and process variables.

Process variables are typically measurements of the electrical system state and are used by the controller 110 to, among other things, determine how well its objectives are being met. These process variables may be read and used by the controller 110 to generate new control variable values. The rate at which process variables are read and used by the controller 110 depends upon the application but typically ranges from once per millisecond to once per hour. For battery energy storage system applications, the rate is often between 10 times per second and once per 15 minutes. Examples of process variables may include:
  Unadjusted net power
  Unadjusted demand
  Adjusted net power
  Demand
  Load (e.g., load energy consumption for one or more loads)
  Generation for one or more loads
  Actual ESS charge or generation rate for one or more ESSs
  Frequency
  Energy storage device state of charge (SoC) (%) for one or more ESSs
  Energy storage device temperature (deg. C) for one or more ESSs
  Electrical meter outputs such as kilowatt-hours (kWh) or demand.

A configuration received by the controller 110 (or input to the controller 110) may include and/or be received as one or more configuration elements (e.g., a set of configuration elements). The configuration elements may specify one or more constraints associated with operation of the electrical system. The configuration elements may define one or more cost elements associated with operation of the electrical system 102. Each configuration element may set a status, state, constant or other aspect of the operation of the electrical system 102. The configuration elements may be values that are typically constant during the operation of the controller 110 and the electrical system 102 at a particular location. The configuration elements may specify one or more constraints of the electrical system and/or specify one or more cost elements associated with operation of the electrical system.

Examples of configuration elements may include:
  ESS type (for example if a battery: states of charge, chemistry, manufacturer, and cell model)

ESS configuration (for example, if a battery: number of cells in series and parallel) and constraints (such as maximum charge and discharge powers)

ESS efficiency properties

ESS degradation properties (as a function of SoC, discharge or charge rate, and time)

Electricity supply tariff (including time of use supply rates and associated time windows)

Electricity demand tariff (including demand rates and associated time windows)

Electrical system constraints such as minimum power import

ESS constraints such as SoC limits or power limits (including maximum and minimum state of charge)

Historic data such as unadjusted net power or unadjusted demand, weather data, and occupancy Operational constraints such as a requirement for an ESS to have a specified minimum amount of energy at a specified time of day.

External inputs are variables that may be used by the controller 110 and that may change during operation of the controller 110. Examples are weather forecasts (e.g., irradiance for solar generation and wind speeds for wind generation) and event data (e.g., occupancy predictions). In some embodiments, tariffs (e.g., demand rates defined therein) may change during the operation of the controller 110, and may therefore be treated as an external input.

The outputs of the controller 110 are the control variables that can affect the electrical system behavior. Examples of control variables are:

ESS power command (kW or %). For example, an ESS power command of 50 kW would command the ESS to charge at a rate of 50 kW, and an ESS power command of −20 kW would command the ESS to discharge at a rate of 20 kW Building or subsystem net power increase or reduction (kW or %)

Renewable energy increase or curtailment (kW or %). For example a photovoltaic (PV) system curtailment command of −100 kW would command a PV system to limit generation to no less than −100 kW. Again, the negative sign is indicative of the fact that the value is generative (non-consumptive)

A demand setpoint representative of an upper limit on demand.

In some embodiments, control variables that represent power levels may be signed, e.g., positive for consumptive or negative for generative.

In one illustrative example, consider that an objective of the controller 110 may be to reduce demand charges while preserving battery life. In this example, only the ESS may be controlled. To accomplish this objective, the controller should have knowledge of a configuration of the electrical system 102, such as the demand rates and associated time windows, the battery capacity, the battery type and arrangement, etc. Other external inputs may also be used to help the controller 110 meet its objectives, such as a forecast of upcoming load and/or forecast of upcoming weather (e.g., temperature, expected solar irradiance, wind). Process variables from the electrical system 102 that may be used may provide information concerning a net electrical system power or energy consumption, demand, a battery SoC, an unadjusted building load, and an actual battery charge or discharge power.

In this one illustrative example, the control variable may be a commanded battery ESS's charge or discharge power. In order to more effectively meet the objective, the controller 110 may continuously track the peak adjusted net power (kW) for the building over each applicable time window, and use the battery to charge or generate at appropriate times to limit the demand charges. In one specific example scenario, the ESS may be utilized to attempt to achieve substantially flat (or constant) demand from the electrical utility distribution system 150 (e.g., the grid) during an applicable time window when a demand charge applies.

The controller 110 may continuously or periodically adjust the one or more demand setpoints to limit a peak of the adjusted net power of the building. For example, the controller 110 may compare the demand setpoint and the adjusted demand setpoint every fifteen minutes and each time, if the adjusted demand is greater than the demand setpoint by a threshold amount, the controller 110 may increase the demand setpoint. In some embodiments, the controller 110 may not reduce the demand setpoint based on the comparison. Instead, the controller 110 may simply reduce the demand setpoint periodically independent of the comparison and independently of any increase.

By continuously or periodically adjusting the setpoint, the controller 110 may optimize the use of energy by the building electrical system 102 by maintaining a low average setpoint. Having a low average setpoint may cause the setpoint to be low during a demand window, regardless of knowledge of the demand window beginning and ending, thereby lowering the demand charge.

Figure 2:
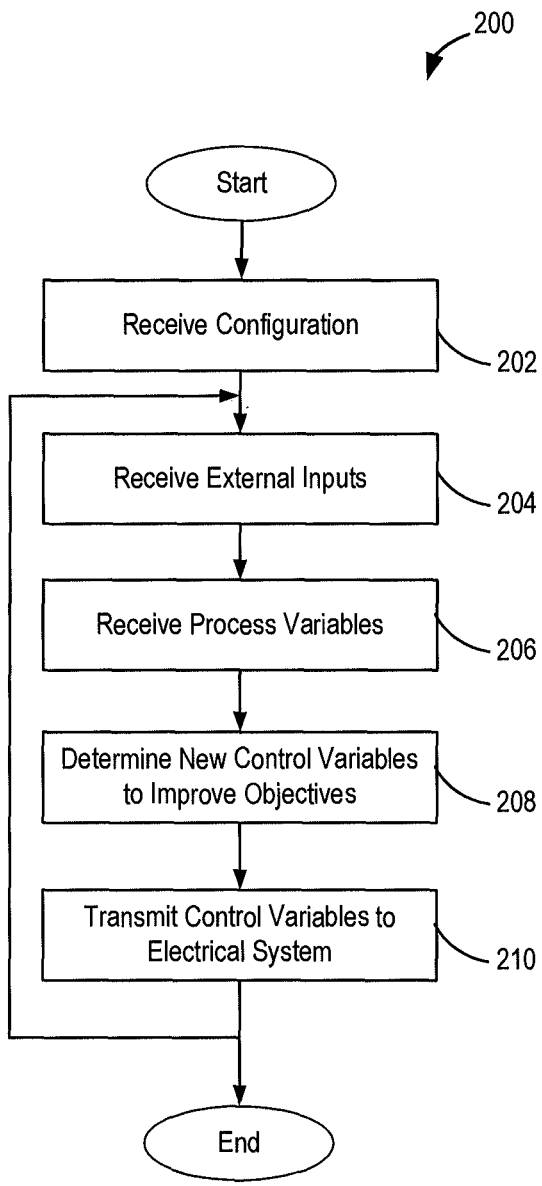
FIG. 2 is a flow diagram of a method or process of controlling an electrical system, according to one embodiment of the present disclosure.

FIG. 2 is a flow diagram of a method 200 or process of controlling an electrical system, according to one embodiment of the present disclosure. The method 200 may be implemented by a controller of an electrical system, such as the controller 110 of FIG. 1 controlling the building electrical system 102 of FIG. 1. The controller may receive 202 or otherwise receive a configuration (e.g., a set of configuration elements) of the electrical system.

The controller may also receive 204 or otherwise receive external inputs, such as weather reports (e.g., temperature, solar irradiance, wind speed), changing tariffs, event data (e.g., occupancy prediction, sizeable gathering of people at a location or venue), and the like.

The controller may also receive 206 or otherwise receive process variables, which may be measurements of a state of the electrical system and indicate, among other things, how well objectives of the controller are being met. The process variables provide feedback to the controller as part of a feedback loop.

Using the configuration, the external inputs, and/or the process variables, the controller determines 208 new control variables to improve achievement of objectives of the controller. Stated differently, the controller determines 208 new values for each control variable to effectuate a change to the electrical system toward meeting one or more controller objectives for the electrical system. One control variable that is determined is a demand setpoint to limit a peak of the adjusted demand of the building. Once determined, the control variables (or values thereof) are transmitted 210 to the electrical system or components of the electrical system. The transmission 210 of the control variables to the electrical system allows the electrical system to process the control variables to determine how to adjust and change state, which thereby can effectuate the objective(s) of the controller for the electrical system. In determining new control variables the controller may determine a demand setpoint to limit a peak of the adjusted demand of the building. The demand setpoint may be determined based on a previous demand setpoint and the peak adjusted net power. For example, if the previous demand setpoint was exceeded by the peak adjusted demand the demand setpoint may be set to a higher value than the previous demand setpoint. If the previous demand setpoint was not exceeded by the peak adjusted demand the demand setpoint may be set to a lower value than the previous demand setpoint.

Figure 3:
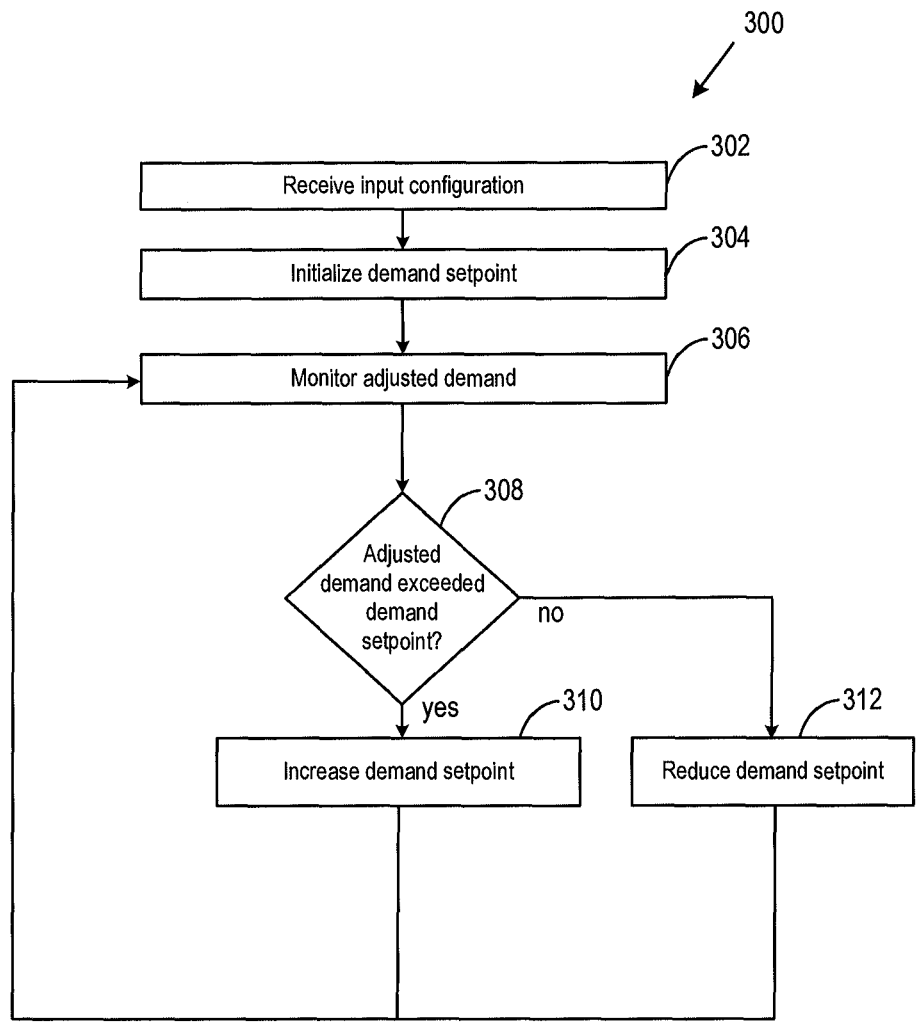
FIG. 3 is a flow diagram of a method of controlling an electrical system with a demand setpoint, according to one embodiment of the present disclosure.

FIG. 3 is a flow diagram of a method 300 of controlling an electrical system with a demand setpoint, according to one embodiment of the present disclosure. By continuously or periodically adjusting the setpoint, a controller may optimize the use of energy by a building electrical system by maintaining a low average setpoint. For example, the setpoint may be adjusted every 5 minutes based on what conditions were present in those 5 minutes or at the end of those five minutes. The setpoint may also be adjusted on a continuous or instantaneous basis. For example, an adjustment may be made when a condition is met. In some embodiments, the reduction to demand setpoint may be periodic and the increase for the demand setpoint may be continuous. In some embodiments, the reduction to demand setpoint may be continuous and the increase for the demand setpoint may be periodic. Having a low average setpoint may cause the setpoint to be low during a demand window, regardless of knowledge of the demand window beginning and ending, thereby lowering the demand charge. The method 300 may be a computer-implemented process executed by one or more computing devices (e.g., controller 110 of FIG. 1).

The method 300 may adjust the demand setpoint based on the adjusted demand of an electrical system. In some embodiments, the demand setpoint may be a control variable provided to the electrical system to effectuate a change in the electrical system. In some embodiments, additional steps may be taken to determine control variables based on the demand setpoint and those additional control variables may be provided to the electrical system. For example, an ESS power command, a building or subsystem net power increase or reduction command, a renewable energy increase or curtailment command, or a generator increase or curtailment command may be provided to the electrical system to effectuate a change to the electrical system to attempt to comply with the demand setpoint.

The method 300 may receive 302 a configuration, or a set of configuration elements, of the electrical system. The configuration may specify one or more constraints of the electrical system. For example, the configuration may specify battery performance parameters, battery energy capacity, maximum battery charge and discharge rates, minimum import constraints, and the applicable utility tariff. The configuration may specify one or more constants of the electrical system. The configuration may specify one or more cost elements associated with operation of the electrical system. The cost elements may include one or more of an electricity cost (e.g., an electricity supply charge, an electricity demand charge), a battery degradation cost, equipment degradation cost, a tariff definition (e.g., an electricity supply tariff providing time of use (ToU) supply rates and associated time windows, or an electricity demand tariff providing demand rates and associated time windows), a cost of local generation, penalties associated with deviation from an operating plan (e.g., a prescribed operating plan, a contracted operating plan), costs or benefits associated with a change in energy in the ESS such that adding energy between the beginning and the end of the future time domain is valued, costs or benefits (e.g., a payment) for contracted maneuvers, costs or benefits associated with the amount of energy stored in an ESS as a function of time, a value of comfort that may be a function of other process variables such as building temperature.

The method 300 may initialize 304 a demand setpoint. A demand setpoint represents an upper limit on demand (i.e., adjusted demand). A demand setpoint may be a value, a constant, or a variable that may be set to a value. In some embodiments, the demand setpoint may be initialized to an arbitrary number. In some embodiments, a user may set the initial demand setpoint. In some embodiments, a controller may determine a max adjusted demand of the electrical system and initialize a setpoint at the max adjusted demand. In some embodiments, a controller may determine an average adjusted demand of the electrical system and initialize a setpoint at the average adjusted demand. In some embodiments, a controller may predict a demand consumption during a future time period of the electrical power system based on historic load data.

A controller using method 300 may monitor 306 the adjusted demand of the electrical system, and determine 308 whether the adjusted demand exceeded the demand setpoint. If the adjusted demand has not exceeded the demand setpoint, the controller using method 300 may reduce 312 the demand setpoint. If the adjusted demand has exceeded the demand setpoint, the controller using method 300 may increase 310 the demand setpoint.

Rather than rely on knowledge of when a demand charge is reset, some embodiments herein adjust the demand setpoint periodically or continuously regardless of when the demand charge is reset. This may reduce demand charges independent of, and without knowledge of, billing demand calculation periods or meter read times.

In some embodiments a controller using method 300 may adjust (e.g., reduce or increase) the setpoint continuously. In some embodiments, certain events may cause the controller to evaluate and adjust the setpoint. For example, the controller may adjust the setpoint during an optimization process.

In some embodiments a controller using method 300 may adjust (e.g., reduce or increase) the setpoint periodically. For example, the controller may adjust the setpoint every minute, every hour, or daily by a small amount. For instance, the controller may adjust the demand setpoint at midnight. This adjustment may be part of a daily calculation for control variables. The controller may adjust the setpoint then generate control variables to attempt to achieve the adjusted setpoint.

In some embodiments, the controller may cause the adjusted demand over an interval of time on the data storage device to be stored. To determine 308 if the adjusted demand exceeded the demand setpoint, the controller may compare the adjusted demand over the interval of time to the demand setpoint. For instance, every hour the controller may check to see if during the previous hour the adjusted demand exceeded the demand setpoint. The demand setpoint may be increased or decreased more frequently than the billing demand calculation period.

The amount that the demand setpoint is reduced or increased may, in certain embodiments, be based on electrical system parameters. For example, adjustment may be a fraction of the system power. In some embodiments, the demand setpoint may be reduced or increased by a fraction of power available to the electrical power system from sources other than the electrical utility distribution system. For example, the demand setpoint may adjusted by reducing or increasing the demand setpoint by a portion of the power stored by an ESS and/or power that a generator is capable of providing.

In some embodiments, the demand setpoint may be reduced or increased by a fraction of the average load of the electrical system. For example, the demand setpoint may be reduced by the controller by 3% of the average building load per day. In some embodiments the controller may reduce or increase the setpoint by a fraction of a difference between a peak in the adjusted demand and the demand setpoint. In some embodiments, the demand setpoint reduction is based on an adjustable parameter.

In some embodiments, the controller may use the demand setpoint to optimize the electrical system for the current conditions. In some embodiments, the controller may determine the demand setpoint and predict a load of the electrical system during a future time. The controller may then optimize the electrical system for the determined demand setpoint and the predicted load of the electrical system.

In many jurisdictions, demand charges are based on the maximum demand during a billing cycle (often monthly). In these situations, a controller may be configured to reduce or reset one or more demand setpoints at the start of each billing cycle (which is generally also the end of the previous billing cycle). When the setpoint is reduced substantially or reset, the controller begins again striving for low demand charges during a new billing cycle. But in some cases, it may not be possible or convenient to know the date and time at which each billing cycle begins. Or, the billing cycle change may depend upon a technician visiting and reading a smart meter at the customer's point of interconnect, in which case it may be very difficult to predict or know exactly when the smart meter is read. Thus, an alternate approach may be used in which the demand setpoint is continuously or periodically reduced more frequently than once per month. Using this approach eliminates complexity in the controller design and may result in demand charge reduction that is as good or better than resetting setpoints at the beginning of the billing cycle.

Figure 4:
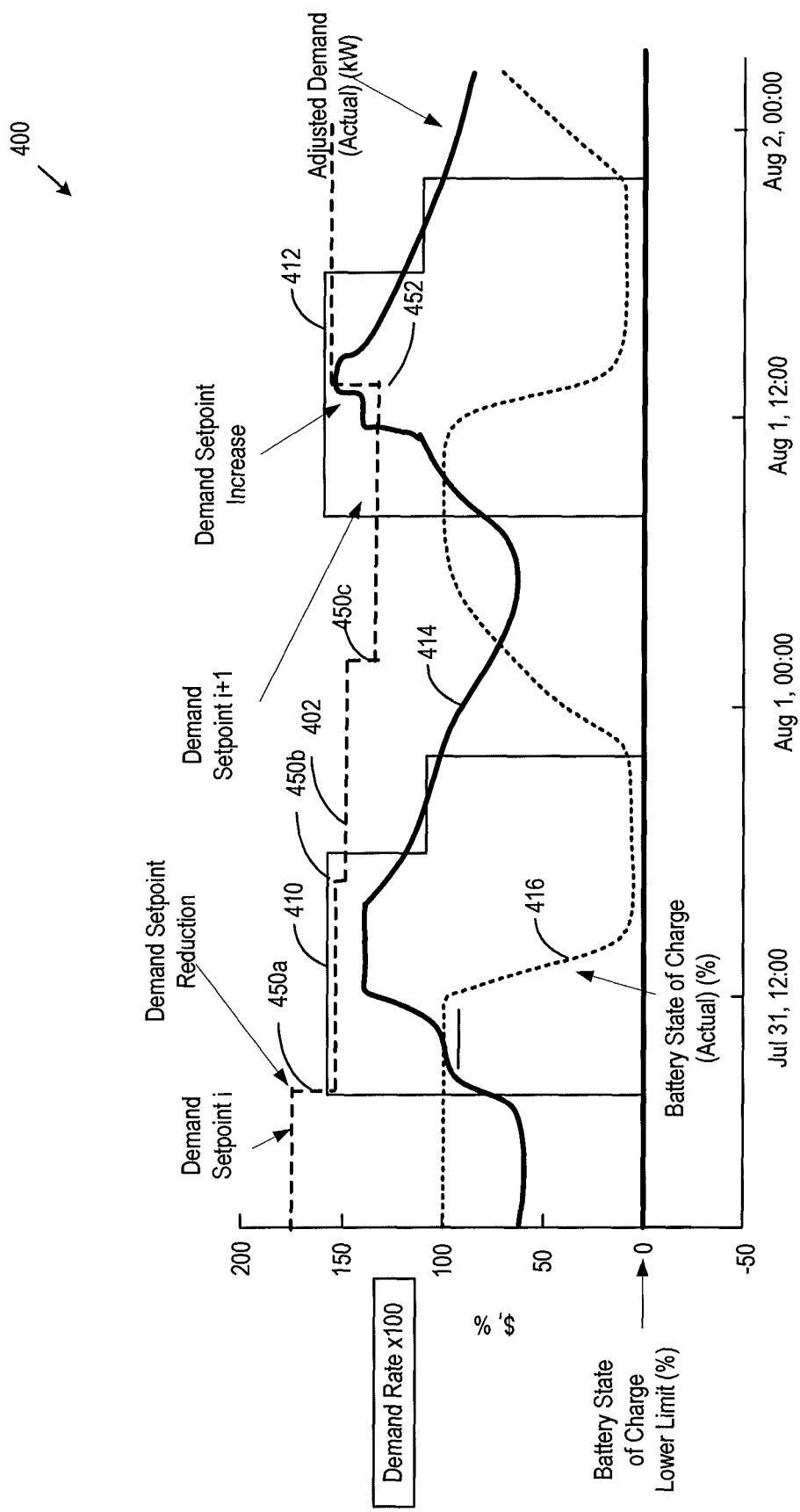
FIG. 4 is a graph showing an example of a controller operating over approximately two days to reduce demand charges using setpoints, according to one embodiment.

FIG. 4 is a graph 400 showing an example of a controller operating over approximately two days to reduce demand charges using setpoints 402. In this example, the controller adjusts the setpoint 402 periodically based on a relation between the adjusted demand 414 and the setpoint 402 regardless of the demand setpoint windows 410 and 412. By periodically adjusting the setpoint 402, the controller may optimize the use of energy by the building electrical system by lowering an average setpoint. Having a lower average setpoint may mean that the setpoint will be lower during a demand window, regardless of knowledge of the demand window beginning and ending. Because demand charges for each demand window may be calculated as a demand rate multiplied by the peak demand during the associated demand window, a lower setpoint may lower the peak demand, thereby lowering the demand charge.

As shown, in some embodiments, the setpoint 402 may be decreased periodically if the adjusted demand 414 has not exceeded the setpoint 402 during a previous period of time (e.g., demand setpoint reductions 450a, 450b, 450c, collectively referred to herein as demand setpoint reduction 450). As shown, this may result in a lower setpoint 402 during the demand window 410. The lower setpoint 402 results in a lower demand charge The amount of a single demand setpoint reduction 450 may be a fraction of the available electrical system power, or a fraction of the average load. In the illustrated embodiment, each demand setpoint reduction is based on the battery state of charge 416. When the battery is fully charged more power is available to the electrical system, therefore in some embodiments the demand setpoint decreases by a larger amount when the battery is fully charged. In the illustrated embodiment, a first demand setpoint reduction 450a occurs when the battery state of charge 416 is near 100%. The first demand setpoint reduction 450a is larger than a second demand setpoint reduction 450b that occurs when the battery state of charge is near 5%.

In some embodiments, a demand setpoint increase may occur when the adjusted demand 414 has exceeded the setpoint 402 during a previous period of time (e.g., demand setpoint increase 452). The demand setpoint increase 452 may be based on a fraction of the available electrical system power, a fraction of the average load or demand, the max adjusted net power, a difference between a peak in the adjusted demand and the demand setpoint, or a difference between the adjusted net power and a previous setpoint. In some embodiments, the demand setpoint may increase more when there is less available electrical system power. This may be opposite the demand setpoint reduction 450. In some embodiments, the demand setpoint increase is based on an adjustable parameter.

In some embodiments, the amount that the setpoint 402 is decreased or increased may be a function of the previous adjustment. For example, a first demand setpoint reduction may be larger than a second demand setpoint reduction. In other words, the amount that a demand setpoint is reduced may increase for each consecutive demand setpoint reduction. As another example, the amount of a demand setpoint increase may increase for each consecutive demand setpoint increase.

The beginning and ending of a demand window may be unknown. For example, some utilities use human meter readers that inherently cannot read every meter at the same time. Meter readers may even be days late to read a meter. Thus, because the demand window timing may be based on when a meter is read, it can be difficult to know when a demand window ends and a new demand window begins. Periodically or continuously adjusting the demand setpoint 402, in lieu of or in addition to attempting to determine the timing of a demand window, can lead to lower demand setpoints on average during demand windows, thereby lowering the demand charge.

While the illustrated embodiment reduces or increases the setpoint 402 periodically, other embodiments may continuously decrease or increase the setpoint. A continuously decreasing or increasing setpoint may be a linear, logarithmic, parabolic, or a step function. In some embodiments, the setpoint may be a combination function. For example, until the adjusted demand 414 exceeds the setpoint 402, the setpoint 402 may decrease linearly, and when the adjusted demand 414 exceeds the setpoint 402, the setpoint 402 may be a step function that increases by a fraction of the building load.

Figure 5:
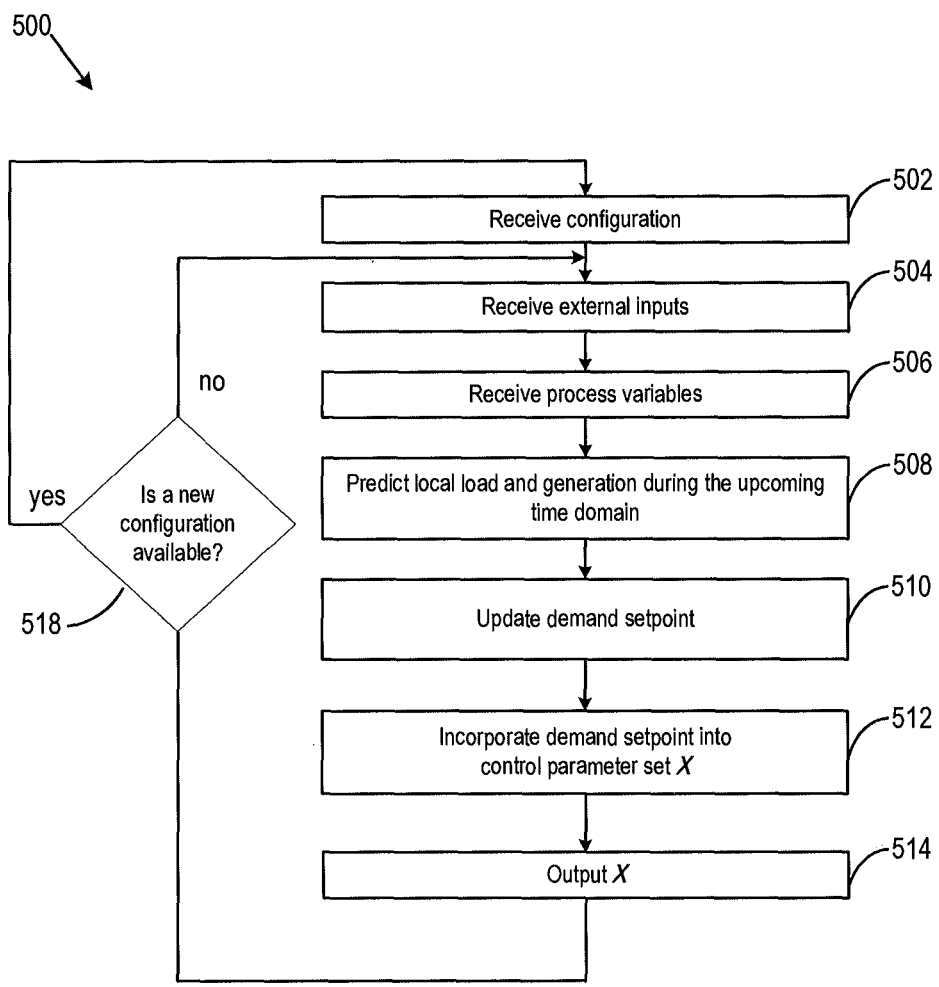
FIG. 5 is a flow diagram of a method of issuing a control parameter set, according to one embodiment of the present disclosure.

FIG. 5 is a flow diagram of a method 500 of issuing a control parameter set X, according to one embodiment of the present disclosure. The method 500 may be a computer-implemented process executed by one or more computing devices. While there are many ways to define a control parameter set X, three possible approaches are:
1. a single set of parameters of a control law to be applied during the entire upcoming time domain;
2. a sequence of parameter sets that are each to be applied to a single control law at different contiguous sequential time intervals throughout the upcoming time domain; and
3. a sequence of parameters that specifies different control laws to be applied at different contiguous sequential time intervals throughout the future time domain.

The method 500 may receive 502 a configuration, or a set of configuration elements, of the electrical system. The configuration may specify one or more constraints of the electrical system. For example, the constraints may include a minimum battery state of charge that defines how far a battery may be depleted. The configuration may specify one or more constants of the electrical system and an electricity demand tariff providing demand rates and associated time windows.

External inputs may also be received 504. The external inputs may provide indication of one or more conditions that are external to the controller and/or the electrical system. For example, the external inputs may provide indication of the temperature, weather conditions (e.g., patterns, forecasts), and the like.

Process variables are received 506. The process variables provide one or more measurements of a current state of the electrical system. The set of process variables can be used to determine progress toward meeting an objective (e.g., more economical operation) of the electrical system. The process variables may be feedback in a control loop for controlling the electrical system.

The method 500 may include predicting 508 a local load and/or generation during an upcoming time domain. The predicted 508 local load and/or local generation may be stored for later consideration. For example, the predicted 508 load and/or generation may be used in a later process of evaluating (e.g., determining, simulating operation of the electrical system using) the demand setpoint in a future time period. In some embodiments, the local load and/or generation during the upcoming time domain may not be predicted. In some embodiments, the adjusted demand is continuously compared to the demand setpoint, and the demand setpoint is increased whenever the adjusted demand exceeds the demand setpoint by a target threshold.

A demand setpoint may be updated 510 to be applied during an upcoming or current time domain. The demand setpoint may be updated 510 using the update demand setpoint method 300 described above with reference to FIG. 3. Updating 510 the demand setpoint reduces the demand setpoint if the adjusted demand did not exceed the demand setpoint, and increases the demand setpoint if the adjusted demand did exceed the demand setpoint.

The updated demand setpoint is incorporated 512 into a control parameter set X. The control parameter set X is then output 514. In some embodiments, the control parameter set X may be altered based on the setpoint. In some embodiments, the output 514 of the control parameter set X may be stored locally, such as to memory, storage, circuitry, and/or a processor. In some embodiments, the outputting 514 may include transmission of the control parameter set X over a communication network to a remote computing device.

The method 500 repeats for a next upcoming time domain (a new upcoming time domain). A determination 518 is made whether a new configuration is available. If yes, then the demand method 500 receives 502 the new configuration. If no, then the method 500 may skip receiving 502 the configuration and simply receive 504 the external inputs.

Figure 6:
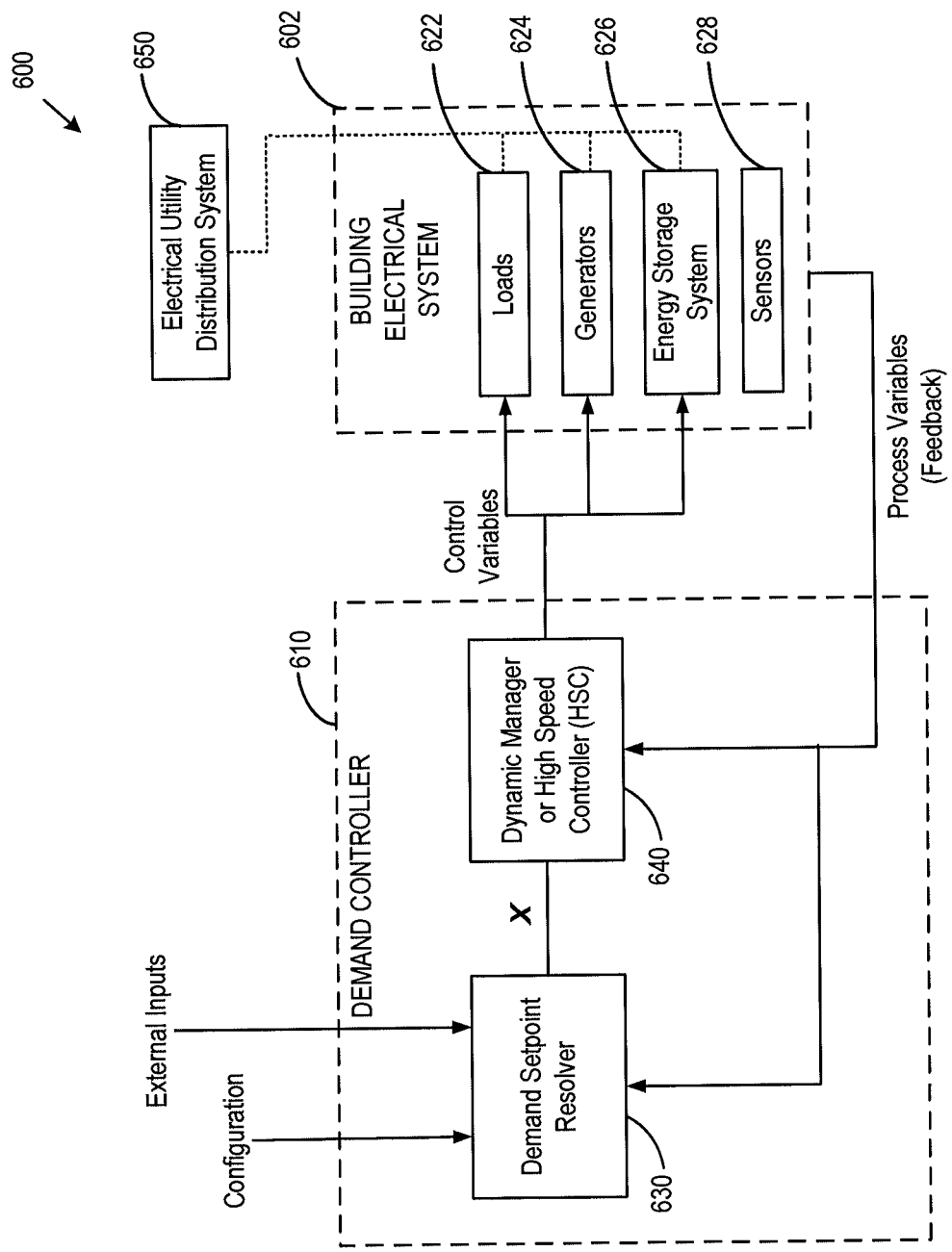
FIG. 6 is a control diagram of an electrical system with a demand controller, according to one embodiment.

FIG. 6 is a control diagram of an electrical system 600 with a demand controller 610, according to one embodiment. The demand controller 610 generates control variables which control a building electrical system 602 and cause an ESS 626 to charge or generate (discharge) at different moments in time.

The electrical system 600 comprises the building electrical system 602 that is controlled by the demand controller 610. The building electrical system 602 includes one or more loads 622, one or more generators 624, the ESS 626, and one or more sensors 628 (e.g., meters) to provide measurements or other indication(s) of a state of the building electrical system 602. The building electrical system 602 is coupled to an electrical utility distribution system 650, and therefore may be considered on-grid. Similar diagrams can be drawn for other applications such as a photovoltaic generator plant and an off-grid building.

The demand controller 610 receives configuration information of the electrical system 600, external inputs, and process variables and produces control variables to be sent to the electrical system 600 to effectuate a change to the electrical system 600 toward meeting a controller objective for the electrical system 600. The demand controller 610 may include electronic hardware and software to process the inputs (e.g., the configuration of the electrical system 600, external inputs, and process variables) to determine values for each of the control variables. The demand controller 610 may include one or more processors and suitable storage media to store programming in the form of executable instructions, which are executed by the processors to implement the control processes.

In the embodiment of FIG. 6, the demand controller 610 includes a demand setpoint resolver 630 and a dynamic manager 640 (or high speed controller (HSC)). The demand setpoint resolver 630 may perform method 500 of issuing a control parameter set X as described above with reference to FIG. 5 and may determine and/or adjust a demand setpoint as described above with reference to FIG. 3.

In the embodiment of FIG. 6, the demand setpoint resolver 630 determines a demand setpoint as part of determining a set of values for a control parameter set X. The demand setpoint resolver 630 provides the set of values and/or the control parameter set X to the HSC 640 to effectuate a change to the electrical system 600 to comply with the demand setpoint. The electrical system 600 attempts to comply with the demand setpoint by maintaining power consumption below the demand setpoint. The demand setpoint resolver 630 may use a demand setpoint algorithm to determine a set of values for the control parameter set X to effectuate a change to the electrical system 600 to comply with the demand setpoint. In some embodiments, the demand setpoint algorithm may consider specific configuration and/or external inputs along with the process variables. Some examples of configuration information, external inputs, and process variables the charge algorithm may consider are:

Past, present, or future-predicted ESS state of charge
Past, present, and/or future time-of-use electricity supply rate
Past, present, and/or future demand rate
Charge power limits due to size of the ESS or energy conversion systems that are part of the ESS
ESS efficiency as a function of charge rate and state of charge
ESS energy storage device degradation rate as a function of state of charge and/or charge rate
Remaining time in charge control mode
ESS size
Past, present, or predicted unadjusted net load
Past, present, or predicted adjusted net load
Past, present, or predicted ESS power For example, if the past or present ESS power multiplied by remaining time in the future time domain is greater than the remaining ESS energy, the demand setpoint resolver 630 may choose a control parameter set X that calls for a decrease in ESS power and an increase in generator power 624 to comply with the demand setpoint.

The HSC 640 utilizes the set of values for the control parameter set X to determine the control variables to communicate to the electrical system 600. The control variables effectuate a change to the building electrical system 602 to comply with the demand setpoint. For example, the control variables may cause the ESS 626 to increase energy distribution to the loads 622. The HSC 640 in some embodiments is also presumed to have the ability to measure or obtain a current date and time. The two part approach of the demand controller 610, namely the demand setpoint resolver 630 determining control parameters and then the HSC 640 determining the control variables, enables generation of a lasting set of controls, or a control solution (or plan) that can be used into the future rather than a single control to be applied at the present.

The two part approach of the demand controller 610 enables the demand setpoint resolver 630 to be disposed or positioned at a different location from the HSC 640. In this way, intensive computing operations that may be involved in determining a demand setpoint and/or values for the control parameter set X can be performed by resources with higher processing capability that may be located remote from the building electrical system 602. These intensive computing operations may be performed, for example, at a data center or server center (e.g., in the cloud).

In one embodiment, the demand controller 610 and one or more of its components are executed as software or firmware (for example stored on non-transitory media, such as appropriate memory) by one or more processors. For example, the demand setpoint resolver 630 may comprise one or more processors to process the inputs and generate the set of values for the control parameter set X. Similarly, the HSC 640 may comprise one or more processors to process the control parameter set X and the process variables and generate the control variables. The processors may be computers, microcontrollers, CPUs, logic devices, or any other digital or analog device that can operate on pre-programmed instructions. If more than one processor is used, they can be connected electrically, wirelessly, or optically to pass signals between one another. In addition, the control variables can be communicated to the electrical system components electrically, wirelessly, or optically or by any other means. The processor has the ability to store or remember values, arrays, and matrices, which can be viewed as multi-dimensional arrays, in some embodiments. This storage may be performed using one or more memory devices, such as read access memory (RAM, disk drives, etc.).

Figure 7:
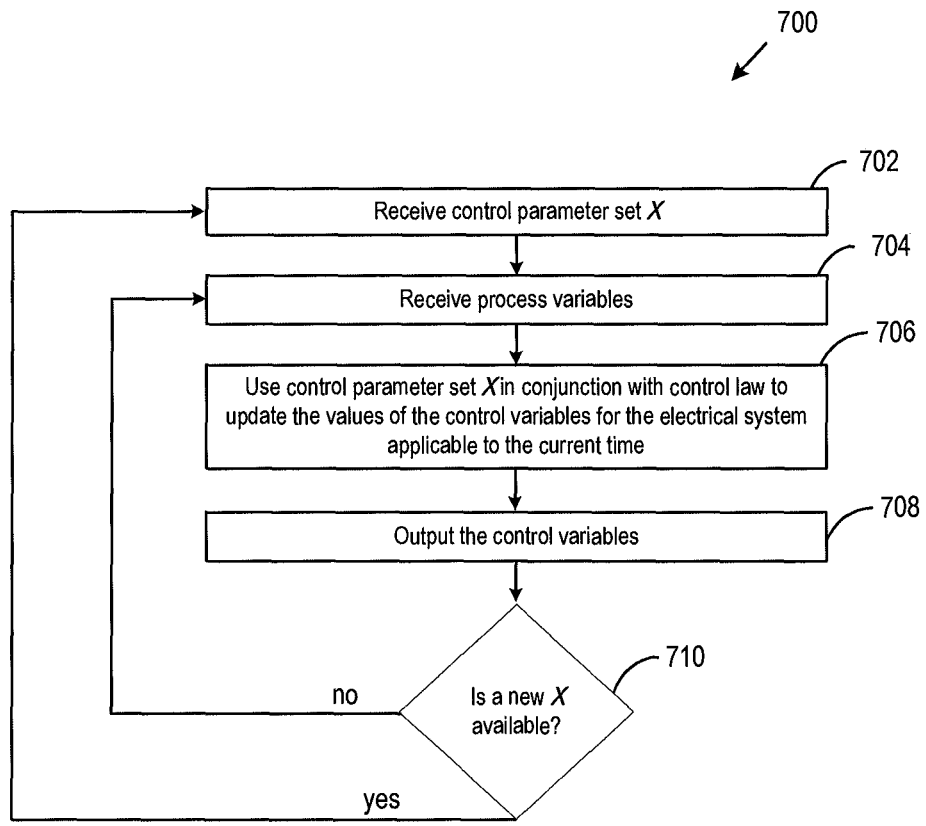
FIG. 7 illustrates a method that a high speed controller (HSC) may use to output control variables, according to one embodiment.

FIG. 7 illustrates a method 700 that a HSC may implement or otherwise use to output control variables to control an electrical system, according to one embodiment. A control parameter set X is received 702 (e.g., by the HSC). A set of process variables is received 704. The output control variables may be updated 706 subject to a set of predefined control laws and the control parameter set X, while observing the set of process variables. The control variables are output 708 to an electrical system to control certain components of the electrical system and to accomplish the objective(s) of the controller.

Because the control parameter set X is passed to the HSC, the definition of the control parameters is tightly linked to the HSC's control law, in one embodiment. For example, in one example embodiment, a task of the HSC is to control some or all of the electrical system components within the electrical system based on the currently-applicable control parameter set X. The HSC can continue to control these components until a new set of control parameters is received 710.

The time between receiving control parameters can be called a "time segment." In some embodiments, a battery energy storage system may have a rate at which the process variables are read and used by the HSC and new control variables are generated from 10 times per second to once per 15 minutes.

Defining or updating 706 the control parameter set X involves defining or otherwise specifying times at which each control parameter is to be applied during a future time domain, and the control law(s) that are to be applied at each time in the future time domain.

One embodiment of a HSC for battery energy storage systems uses four parameters for each time segment. Each of the four parameters is defined in Table 1. In one embodiment, these parameters are used by the HSC to control the battery inverter to charge or discharge the energy storage. While there are many ways to define a control parameter set X, three possible approaches are:

1. a single set of parameters of a control law to be applied during the entire upcoming time domain;
2. a sequence of parameter sets that are each to be applied to a single control law at different contiguous sequential time intervals throughout the upcoming time domain; and
3. a sequence of parameters that specifies different control laws to be applied at different contiguous sequential time intervals throughout the future time domain.

An example of Approach 1 above of a single set of parameters of the control parameter set X (and example values) for a four-parameter control law is shown in Table 1.

TABLE 1

| Parameter | Description | Example Value |
|---|---|---|
| $P_{nom}$ | Nominal ESS power (or discharge power if negative) to be applied in the absence of other constraints or rules (such as those related to UB, $UB_0$, or LB below). | −10 kW |
| UB | Upper bound on adjusted demand (e.g., an upper setpoint). Not to be exceeded unless the ESS is incapable of discharging at sufficient power. | 100 kW |
| $UB_0$ | Upper bound on electrical system adjusted demand (e.g., an upper setpoint) not to be actively exceeded (e.g., electrical system adjusted demand may exceed this value only with ESS power less than or equal to 0). | 80 kW |
| LB | Lower bound on adjusted net power (e.g., a lower setpoint). Sometimes referred to as "minimum import," or, if 0, "zero export". Adjusted net power will be kept above this value unless the ESS is incapable of charging at sufficient power and generators cannot be throttled sufficiently. | 0 kW |

In one embodiment of a HSC with the parameter set shown in Table 1, the parameter UB can be set equal to the demand setpoint. In some embodiments, the parameter $UB_0$ may be set to a demand setpoint.

Another aspect of the HSC in one disclosed embodiment is that it can also be used to curtail a generator (such as a photovoltaic generator) if necessary to maintain the lower bound on electrical system power consumption specified by LB.

In some embodiments, the parameter set may have fewer or more parameters than the four. For example, some embodiments may include only three parameters: $P_{nom}$, UB, and LB. Alternately, some embodiments may include only two parameters: $P_{nom}$ and UB. Alternately, some embodiments may include only UB or only $P_{nom}$ or any other combination of four or fewer parameters from the above list.

Figure 8:
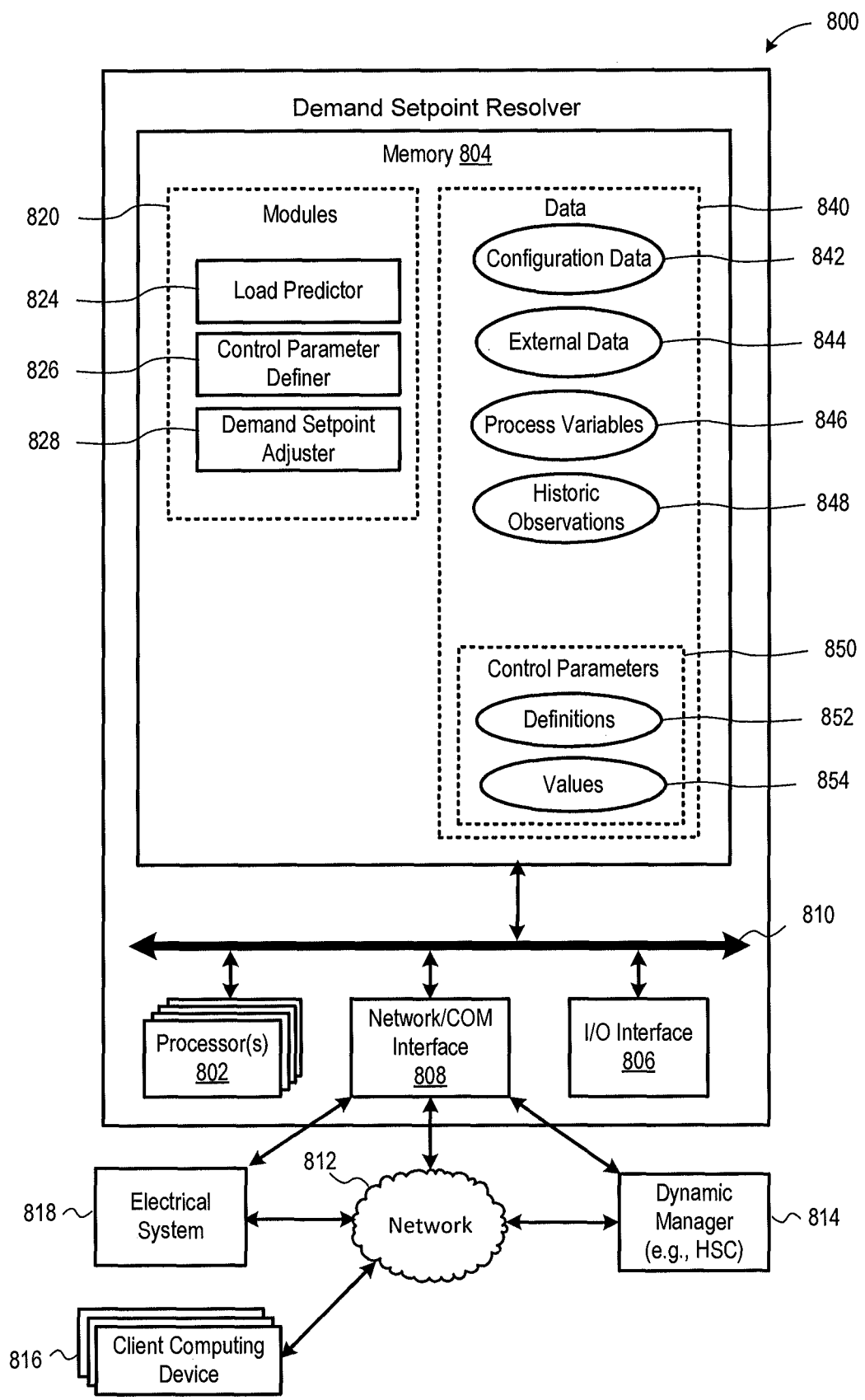
FIG. 8 is a diagram of a demand setpoint resolver, according to one embodiment of the present disclosure.

FIG. 8 is a diagram of a demand setpoint resolver 800 according to one embodiment of the present disclosure. The demand setpoint resolver 800 may determine a control plan for managing control of an electrical system 818 during an upcoming time domain and provide the control plan as output. The determined control plan may include a demand setpoint and a plurality of sets of parameters each to be applied for a different time segment within an upcoming time domain. The demand setpoint resolver 800 may determine the control plan based on a set of configuration elements specifying one or more constraints of the electrical system 818 and defining one or more demand windows associated with operation of the electrical system. The demand setpoint resolver 800 may also determine the control plan based on a set of process variables that provide one or more measurements of a state of the electrical system 818. The demand setpoint resolver 800 may include one or more processors 802, memory 804, an input/output interface 806, a network/COM interface 808, and a system bus 810.

The one or more processors 802 may include one or more general purpose devices, such as an Intel®, AMD®, or other standard microprocessor. The one or more processors 802 may include a special purpose processing device, such as an ASIC, SoC, SiP, FPGA, PAL, PLA, FPLA, PLD, or other customized or programmable device. The one or more processors 802 perform distributed (e.g., parallel) processing to execute or otherwise implement functionalities of the present embodiments. The one or more processors 802 may run a standard operating system and perform standard operating system functions. It is recognized that any standard operating systems may be used, such as, for example, Microsoft® Windows®, Apple® MacOS®, Disk Operating System (DOS), UNIX, IRJX, Solaris, SunOS, FreeBSD, Linux®, ffiM® OS/2® operating systems, and so forth.

The memory 804 may include static RAM, dynamic RAM, flash memory, one or more flip-flops, ROM, CD-ROM, DVD, disk, tape, or magnetic, optical, or other computer storage medium. The memory 804 may include a plurality of program modules 820 and a data 840.

The program modules 820 may include all or portions of other elements of the demand setpoint resolver 800. The program modules 820 may run multiple operations concurrently or in parallel by or on the one or more processors 802. In some embodiments, portions of the disclosed modules, components, and/or facilities are embodied as executable instructions embodied in hardware or in firmware, or stored on a non-transitory, machine-readable storage medium. The instructions may comprise computer program code that, when executed by a processor and/or computing device, cause a computing system to implement certain processing steps, procedures, and/or operations, as disclosed herein. The modules, components, and/or facilities disclosed herein may be implemented and/or embodied as a driver, a library, an interface, an API, FPGA configuration data, firmware (e.g., stored on an EEPROM), and/or the like. In some embodiments, portions of the modules, components, and/or facilities disclosed herein are embodied as machine components, such as general and/or application-specific devices, including, but not limited to: circuits, integrated circuits, processing components, interface components, hardware controller(s), storage controller(s), programmable hardware, FPGAs, ASICs, and/or the like. Accordingly, the modules disclosed herein may be referred to as controllers, layers, services, engines, facilities, drivers, circuits, subsystems and/or the like.

The system memory 804 may also include the data 840. Data generated by the demand setpoint resolver 800, such as by the program modules 820 or other modules, may be stored on the system memory 804, for example, as stored program data 840. The data 840 may be organized as one or more databases.

The input/output interface 806 may facilitate interfacing with one or more input devices and/or one or more output devices. The input device(s) may include a keyboard, mouse, touch screen, light pen, tablet, microphone, sensor, or other hardware with accompanying firmware and/or software. The output device(s) may include a monitor or other display, printer, speech or text synthesizer, switch, signal line, or other hardware with accompanying firmware and/or software.

The network/COM interface 808 may facilitate communication or other interaction with other computing devices (e.g., a dynamic manager 814) and/or networks 812, such as the Internet and/or other computing and/or communications networks. The network/COM interface 808 may be equipped with conventional network connectivity, such as, for example, Ethernet (IEEE 802.3), Token Ring (IEEE 802.5), Fiber Distributed Datalink Interface (FDDI), or Asynchronous Transfer Mode (ATM). Further, the network/COM interface 808 may be configured to support a variety of network protocols such as, for example, Internet Protocol (IP), Transfer Control Protocol (TCP), Network File System over UDP/TCP, Server Message Block (SMB), Microsoft® Common Internet File System (CIFS), Hypertext Transfer Protocols (HTTP), Direct Access File System (DAFS), File Transfer Protocol (FTP), Real-Time Publish Subscribe (RTPS), Open Systems Interconnection (OSI) protocols, Simple Mail Transfer Protocol (SMTP), Secure Shell (SSH), Secure Socket Layer (SSL), and so forth. The network/COM interface 808 may be any appropriate communication interface for communicating with other systems and/or devices.

The system bus 810 may facilitate communication and/or interaction between the other components of the system, including the one or more processors 802, the memory 804, the input/output interface 806, and the network/COM interface 808.

The modules 820 may include a load predictor 824, a control parameter definer 826, and a demand setpoint adjuster 828.

The load predictor 824 may predict a load on the electrical system 818 during an upcoming time domain. The load predictor 824 may utilize a historic profile or historic load observations.

The control parameter definer 826 may generate, create, or otherwise define a control parameter set X, in accordance with a control law. The created control parameters 850 may include a definition 852 and a value 854 and may be stored as data 840.

The demand setpoint adjuster 828 updates a demand setpoint based on a simulation process. The demand setpoint adjuster reduces the demand setpoint if the adjusted demand did not exceed the demand setpoint, and increases the demand setpoint if the adjusted demand exceeded the demand setpoint.

The data 840 may include configuration data 842, external data 844, process variables 846, historic observations 848, and control parameters 850 (including definitions 852 and values 854).

The configuration data 842 may be provided to, and received by, the demand setpoint resolver 800 to communicate constraints and characteristics of the electrical system 818.

The external data 844 may be received as external input (e.g., weather reports, changing tariffs, fuel costs, event data), which may inform the determination of the optimal set of values.

The process variables 846 may be received as feedback from the electrical system 818. The process variables 846 are typically measurements of the electrical system 818 state and are used to, among other things, determine how well objectives of controlling the electrical system 818 are being met.

The historic observations 848 are the record of process variables that have been received. A good example is the set of historic load observations that may be useful in a load predictor algorithm.

As noted earlier, the control parameter definer may create control parameters 850, which may include a definition 852 and a value 854 and may be stored as data 840.

The demand setpoint resolver 800 may provide one or more control parameters 850 as a control parameter set X to the dynamic manager 814 via the network/COM interface 808 and/or via the network 812. The dynamic manager 814 may then utilize the control parameter set X to determine values for a set of control variables to deliver to the electrical system 818 to effectuate a change to the electrical system 818 toward meeting one or more objectives (e.g., improved economic operation) for controlling the electrical system 818.

In other embodiments, the demand setpoint resolver 800 may communicate the control parameter set X directly to the electrical system 818 via the network/COM interface 808 and/or via the network 812. In such embodiments, the electrical system 818 may process the control parameter set X directly to determine control commands, and the dynamic manager 814 may not be included.

In still other embodiments, the demand setpoint resolver 800 may determine values for a set of control variables (rather than for a control parameter set X) and may communicate the set of values for the control variables directly to the electrical system 818 via the network/COM interface 808 and/or via the network 812.

One or more client computing devices 816 may be coupled via the network 812 and may be used to configure, provide inputs, or the like to the demand setpoint resolver 800, the dynamic manager 814, and/or the electrical system 818.

Figure 9:
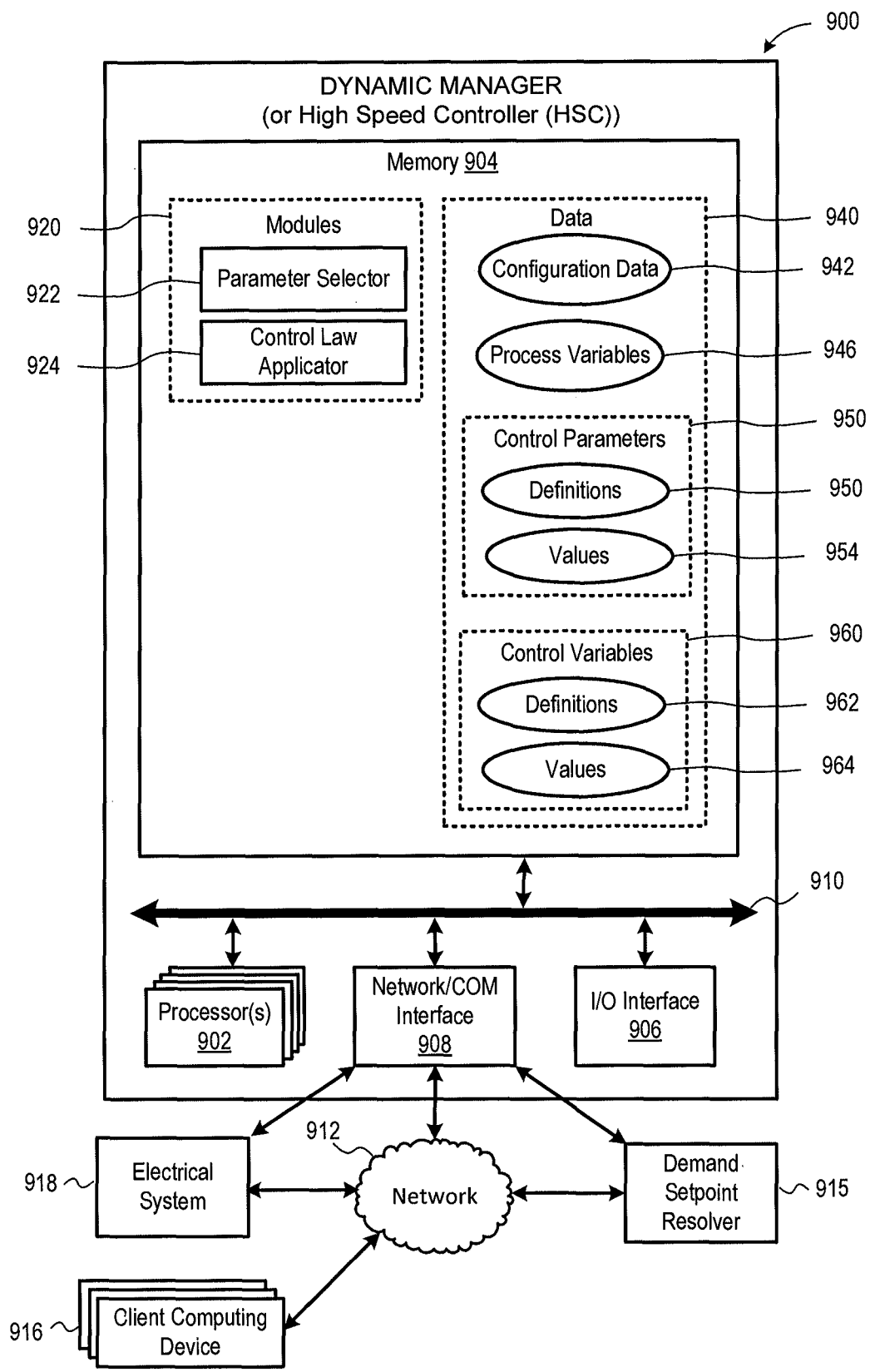
FIG. 9 is a diagram of a dynamic manager, according to one embodiment of the present disclosure.

FIG. 9 is a diagram of a dynamic manager 900, according to one embodiment of the present disclosure. The dynamic manager 900, according to one embodiment of the present disclosure, is a second computing device that may be separate from a demand setpoint resolver 915, which may be similar to the demand setpoint resolver 800 of FIG. 8. The dynamic manager 900 may operate based on input (e.g., a control parameter set X) received from the demand setpoint resolver 915. The dynamic manager 900 may determine a set of control values for a set of control variables for a given time segment of the upcoming time domain and provide the set of control values to an electrical system 918 to effectuate a change to the electrical system 918 toward meeting an objective (e.g., more economical operation) of the electrical system 918 during an upcoming time domain. The dynamic manager 900 determines the set of control values based on a control law and a set of values for a given control parameter set X. The dynamic manager 900 may include one or more processors 902, memory 904, an input/output interface 906, a network/COM interface 908, and a system bus 910.

The one or more processors 902 may include one or more general purpose devices, such as an Intel®, AMD®, or other standard microprocessor. The one or more processors 902 may include a special purpose processing device, such as an ASIC, SoC, SiP, FPGA, PAL, PLA, FPLA, PLD, or other customized or programmable device. The one or more processors 902 perform distributed (e.g., parallel) processing to execute or otherwise implement functionalities of the present embodiments. The one or more processors 902 may run a standard operating system and perform standard operating system functions. It is recognized that any standard operating systems may be used, such as, for example, Microsoft® Windows®, Apple® MacOS®, Disk Operating System (DOS), UNIX, IRJX, Solaris, SunOS, FreeBSD, Linux®, ffiM® OS/2® operating systems, and so forth.

The memory 904 may include static RAM, dynamic RAM, flash memory, one or more flip-flops, ROM, CD-ROM, DVD, disk, tape, or magnetic, optical, or other computer storage medium. The memory 904 may include a plurality of program modules 920 and a program data 940.

The program modules 920 may include all or portions of other elements of the dynamic manager 900. The program modules 920 may run multiple operations concurrently or in parallel by or on the one or more processors 902. In some embodiments, portions of the disclosed modules, components, and/or facilities are embodied as executable instructions embodied in hardware or in firmware, or stored on a non-transitory, machine-readable storage medium. The instructions may comprise computer program code that, when executed by a processor and/or computing device, causes the computing device and/or a computing system to implement certain processing steps, procedures, and/or operations, as disclosed herein. The modules, components, and/or facilities disclosed herein may be implemented and/or embodied as a driver, a library, an interface, an API, FPGA configuration data, firmware (e.g., stored on an EEPROM), and/or the like. In some embodiments, portions of the modules, components, and/or facilities disclosed herein are embodied as machine components, such as general and/or application-specific devices, including, but not limited to: circuits, integrated circuits, processing components, interface components, hardware controller(s), storage controller(s), programmable hardware, FPGAs, ASICs, and/or the like. Accordingly, the modules disclosed herein may be referred to as controllers, layers, services, engines, facilities, drivers, circuits, and/or the like.

The system memory 904 may also include data 940. Data generated by the dynamic manager 900, such as by the program modules 920 or other modules, may be stored on the system memory 904, for example, as stored program data 940. The stored program data 940 may be organized as one or more databases.

The input/output interface 906 may facilitate interfacing with one or more input devices and/or one or more output devices. The input device(s) may include a keyboard, mouse, touch screen, light pen, tablet, microphone, sensor, or other hardware with accompanying firmware and/or software. The output device(s) may include a monitor or other display, printer, speech or text synthesizer, switch, signal line, or other hardware with accompanying firmware and/or software.

The network/COM interface 908 may facilitate communication with other computing devices and/or networks 912, such as the Internet and/or other computing and/or communications networks. The network/COM interface 908 may couple (e.g., electrically couple) to a communication path (e.g., direct or via the network) to the electrical system 918. The network/COM interface 908 may be equipped with conventional network connectivity, such as, for example, Ethernet (IEEE 802.3), Token Ring (IEEE 802.5), Fiber Distributed Datalink Interface (FDDI), or Asynchronous Transfer Mode (ATM). Further, the network/COM interface 908 may be configured to support a variety of network protocols such as, for example, Internet Protocol (IP), Transfer Control Protocol (TCP), Network File System over UDP/TCP, Server Message Block (SMB), Microsoft® Common Internet File System (CIFS), Hypertext Transfer Protocols (HTTP), Direct Access File System (DAFS), File Transfer Protocol (FTP), Real-Time Publish Subscribe (RTPS), Open Systems Interconnection (OSI) protocols, Simple Mail Transfer Protocol (SMTP), Secure Shell (SSH), Secure Socket Layer (SSL), and so forth.

The system bus 910 may facilitate communication and/or interaction between the other components of the system, including the one or more processors 902, the memory 904, the input/output interface 906, and the network/COM interface 908.

The modules 920 may include a parameter selector 922 and a control law applicator 924.

The parameter selector may pick which set of parameters is to be used from the control parameter set X, according to a given time segment.

The control law applicator 924 may process the selected set of parameters from the control parameter set X and convert or translate the individual set of parameters into control variables (or values thereof). The control law applicator 924 may apply logic and/or a translation process to determine a set of values for a set of control variables based on a given set of parameters (from a control parameter set X) for a corresponding time segment. For example, the control law applicator 924 may apply a method and/or logic as shown in FIG. 16.

The data 940 may include configuration data 942, process variables 946, control parameters 950 (including definitions 950 and values 954), and/or control variables 960 (including definitions 962 and values 964).

The configuration data 942 may be provided to, and received by, the dynamic manager 900 to communicate constraints and characteristics of the electrical system 918.

The process variables 946 may be received as feedback from the electrical system 918. The process variables 946 are typically measurements of the electrical system 918 state and are used to, among other things, determine how well objectives of controlling the electrical system 918 are being met. Historic process variables 946 may be utilized by the HSL for example to calculate demand which may be calculated as average building power over the previous 15 or 30 minutes. The dynamic manager 900 can determine the set of control values for the set of control variables based on the process variables 946.

The control parameters 950 may comprise a control parameter set X that includes one or more sets of parameters each for a corresponding time segment of an upcoming time domain. The control parameters 950 may additionally, or alternately, provide a control plan for the upcoming time domain. The control parameters 950 may be received from a demand setpoint resolver 915 as an optimal control parameter set $X_{opt}$.

The control variables 960 may be generated by the parameter selector 922 based on an optimal control parameter set $X_{opt}$.

The dynamic manager 900 may receive the optimal control parameter set $X_{opt}$ from the demand setpoint resolver 915 via the network/COM interface 908 and/or via the network 912. The dynamic manager 900 may also receive the process variables from the electrical system 918 via the network/COM interface 908 and/or via the network 912.

The dynamic manager 900 may provide the values for the set of control variables to the electrical system 918 via the network/COM interface 908 and/or via the network 912.

One or more client computing devices 916 may be coupled via the network 912 and may be used to configure, provide inputs, or the like to the demand setpoint resolver 915, the dynamic manager 900, and/or the electrical system 918.

EXAMPLE EMBODIMENTS

The following are some example embodiments within the scope of the disclosure. In order to avoid complexity in providing the disclosure, not all of the examples listed below are separately and explicitly disclosed as having been contemplated herein as combinable with all of the others of the examples listed below and other embodiments disclosed hereinabove. Unless one of ordinary skill in the art would understand that these examples listed below (and the above disclosed embodiments) are not combinable, it is contemplated within the scope of the disclosure that such examples and embodiments are combinable.

Example 1. A controller of an electrical power system, the controller comprising: a data storage device to store a demand setpoint representing a desired upper limit of demand of an electrical power system; one or more processors operably coupled to the data storage device and configured to: provide at least one control value to the electrical power system to effectuate a change to the electrical power system to attempt to comply with the demand setpoint; monitor an adjusted demand associated with the electrical power system; compare the adjusted demand to the demand setpoint and if the adjusted demand is greater than the demand setpoint, increase the demand setpoint; and reduce the setpoint.

Example 2. The controller of example 1, wherein the one or more processors are configured to reduce or increase the demand setpoint continuously.

Example 3. The controller of example 1, wherein the one or more processors are configured to reduce or increase the demand setpoint periodically Example 4. The controller of example 1, wherein the one or more processors are configured to reduce the demand setpoint periodically independent of the comparison of the adjusted demand and the demand setpoint and to increase the demand setpoint immediately in response to the adjusted demand exceeding the demand setpoint.

Example 5. The controller of example 1, wherein the one or more processors are further configured to: store the adjusted demand over an interval of time on the data storage device, and wherein to compare the adjusted demand to the demand setpoint, the one or more processors compare the adjusted demand over the interval of time to the demand setpoint.

Example 6. The controller of example 5, wherein the one or more processors are configured to reduce or increase the demand setpoint periodically.

Example 7. The controller of example 6, wherein the one or more processors are configured to reduce or increase the demand setpoint every minute.

Example 8. The controller of example 6, wherein the one or more processors are configured to reduce or increase the demand setpoint on an hourly basis.

Example 9. The controller of example 6, wherein the one or more processors are configured to reduce or increase the demand setpoint on a daily basis.

Example 10. The controller of example 1, wherein the demand setpoint is based on a predicted adjusted demand during a future time period of the electrical power system. Make sure in spec how you set (possibly add dependent Example 11. The controller of example 1, wherein the controller is further configured to determine a predicted adjusted demand and increase the demand setpoint when the predicted adjusted demand during a demand reduction period is determined to be higher than the demand setpoint Example 12. The controller of example 1, wherein the demand setpoint is reduced or increased by a fraction of power available to the electrical power system from sources other than electrical utility distribution system.

Example 13. The controller of example 1, wherein the demand setpoint is reduced or increased by a fraction of an average demand of the electrical power system.

Example 14. The controller of example 1, wherein the demand setpoint is reduced or increased by a fraction of a difference between a peak in the adjusted demand and the demand setpoint.

Example 15. The controller of example 1, wherein the demand setpoint reduction is based on an adjustable parameter.

Example 16. The controller of example 1, wherein the one or more processors are configured to reduce the demand setpoint more frequently than the billing demand calculation period.

Example 17. An electrical power control system, comprising: replace power drawn with demand one or more sensors operably coupled to an energy storage system and one or more loads of an electrical power system, the one or more sensors configured to measure power stored by the energy storage system, and demand of the electrical power system; a controller operably coupled to the one or more sensors and the energy storage system, the controller configured to: set a demand setpoint representing a desired upper limit of demand of the electrical power system; monitor the demand of the electrical power system; compare the demand of the electrical power system during a previous period of time to the demand setpoint; and adjust the demand setpoint for a future period of time by: reducing the demand setpoint; and increasing the demand setpoint when the power drawn from an electrical utility distribution system exceeded the demand setpoint during the previous period; and provide at least one control value to the electrical power system to effectuate a change to the electrical power system to attempt to comply with the adjusted demand setpoint.

Example 18. The electrical power control system of example 17, wherein to set the demand setpoint, the controller is further configured to determine a predicted adjusted demand and increase the demand setpoint when the predicted adjusted demand during a demand reduction period is determined to be higher than the demand setpoint.

Example 19. The electrical power control system of example 18, wherein to predict the determine the predicted adjusted demand, the controller scales and offsets the historic load data based on a current load data.

Example 20. The electrical power control system of example 17, wherein the one or more processors are configured to adjust the demand setpoint continuously.

Example 21. The electrical power control system of example 17, wherein the one or more processors are configured to adjust the demand setpoint periodically.

Example 22. The electrical power control system of example 17, wherein the demand setpoint is adjusted by reducing or increasing the demand setpoint by a portion of the power stored by the energy storage system.

Example 23. The electrical power control system of example 17, and further a generator configured to provide power to the energy storage system.

Example 24. The electrical power control system of example 23, wherein the demand setpoint is adjusted by reducing or increasing the demand setpoint based on the power stored by the energy storage system and power that the generator is capable of providing.

Example 25. The electrical power control system of example 17, wherein the demand setpoint is reduced or increased by a fraction of an average of the power used by the one or more loads during the previous period of time.

Example 26. A method for controlling an electrical system, the method comprising: monitoring an adjusted demand associated with the electrical power system; comparing the adjusted demand to the demand setpoint; decreasing the demand setpoint if the adjusted demand has not exceeded the demand setpoint; increasing the demand setpoint if the adjusted demand exceeded the demand setpoint; and providing at least one control value to the electrical power system to effectuate a change to the electrical power system to attempt to comply with the demand setpoint.

Example 27. A method for controlling an electrical system, the method comprising: monitoring an adjusted demand associated with the electrical power system; comparing the adjusted demand to the demand setpoint; decreasing the demand setpoint periodically; increasing the demand setpoint if the adjusted demand exceeded the demand setpoint; and providing at least one control value to the electrical power system to effectuate a change to the electrical power system to attempt to comply with the demand setpoint.

Example 28. The method of Example 27, wherein decreasing the demand setpoint occurs on a periodic basis, and wherein increasing the demand setpoint occurs on a continuous basis.

Example 29. The method of Example 27, wherein reducing the demand setpoint occurs more frequently than a billing demand calculation period.

Example 30. The method of Example 27, further comprising determining a predicted adjusted demand and increasing the demand setpoint when the predicted adjusted demand during a demand reduction period is determined to be higher than the demand setpoint.

Example 31. The method of Example 27, wherein the demand setpoint is reduced or increased by one of a fraction of power available to the electrical power system from sources other than an electrical utility distribution system, a fraction of an average demand of the electrical power system, or a fraction of a difference between a peak in the adjusted demand and the demand setpoint.

Example 32. The controller of Example 1, wherein the one or more processors are configured to reduce the demand setpoint at the beginning of a new billing period.

The described features, operations, or characteristics may be arranged and designed in a wide variety of different configurations and/or combined in any suitable manner in one or more embodiments. Thus, the detailed description of the embodiments of the systems and methods is not intended to limit the scope of the disclosure, as claimed, but is merely representative of possible embodiments of the disclosure. In addition, it will also be readily understood that the order of the steps or actions of the methods described in connection with the embodiments disclosed may be changed as would be apparent to those skilled in the art. Thus, any order in the drawings or Detailed Description is for illustrative purposes only and is not meant to imply a required order, unless specified to require an order.

Embodiments may include various steps, which may be embodied in machine-executable instructions to be executed by a general-purpose or special-purpose computer (or other electronic device). Alternatively, the steps may be performed by hardware components that include specific logic for performing the steps, or by a combination of hardware, software, and/or firmware.

Embodiments may also be provided as a computer program product including a computer-readable storage medium having stored instructions thereon that may be used to program a computer (or other electronic device) to perform processes described herein. The computer-readable storage medium may include, but is not limited to: hard drives, floppy diskettes, optical disks, CD-ROMs, DVD-ROMs, ROMs, RAMs, EPROMs, EEPROMs, magnetic or optical cards, solid-state memory devices, or other types of medium/machine-readable medium suitable for storing electronic instructions.

As used herein, a software module or component may include any type of computer instruction or computer executable code located within a memory device and/or computer-readable storage medium. A software module may, for instance, comprise one or more physical or logical blocks of computer instructions, which may be organized as a routine, program, object, component, data structure, etc. that performs one or more tasks or implements particular abstract data types.

In certain embodiments, a particular software module may comprise disparate instructions stored in different locations of a memory device, which together implement the described functionality of the module. Indeed, a module may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules may be located in local and/or remote memory storage devices. In addition, data being tied or rendered together in a database record may be resident in the same memory device, or across several memory devices, and may be linked together in fields of a record in a database across a network.

The foregoing specification has been described with reference to various embodiments, including the best mode. However, those skilled in the art appreciate that various modifications and changes can be made without departing from the scope of the present disclosure and the underlying principles of the invention. Accordingly, this disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, required, or essential feature or element.

As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Also, as used herein, the terms "coupled," "coupling," or any other variation thereof, are intended to cover a physical connection, an electrical connection, a magnetic connection, an optical connection, a communicative connection, a functional connection, and/or any other connection.

Principles of the present disclosure may be reflected in a computer program product on a tangible computer-readable storage medium having computer-readable program code means embodied in the storage medium. Any suitable computer-readable storage medium may be utilized, including magnetic storage devices (hard disks, floppy disks, and the like), optical storage devices (CD-ROMs, DVDs, Blu-Ray discs, and the like), flash memory, and/or the like. These computer program instructions may be loaded onto a general purpose computer, special purpose computer, or other programmable data processing apparatus to produce a machine, such that the instructions that execute on the computer or other programmable data processing apparatus create means for implementing the functions specified. These computer program instructions may also be stored in a computer-readable memory that can direct a computer or other programmable data processing apparatus to function in a particular manner, such that the instructions stored in the computer-readable memory produce an article of manufacture including instruction means which implement the function specified. The computer program instructions may also be loaded onto a computer or other programmable data processing apparatus to cause a series of operational steps to be performed on the computer or other programmable apparatus to produce a computer-implemented process such that the instructions which execute on the computer or other programmable apparatus provide steps for implementing the functions specified.

Principles of the present disclosure may be reflected in a computer program implemented as one or more software modules or components. As used herein, a software module or component (e.g., engine, system, subsystem) may include any type of computer instruction or computer-executable code located within a memory device and/or computer-readable storage medium. A software module may, for instance, comprise one or more physical or logical blocks of computer instructions, which may be organized as a routine, a program, an object, a component, a data structure, etc. that perform one or more tasks or implement particular data types.

In certain embodiments, a particular software module may comprise disparate instructions stored in different locations of a memory device, which together implement the described functionality of the module. Indeed, a module may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules may be located in local and/or remote memory storage devices. In addition, data being tied or rendered together in a database record may be resident in the same memory device, or across several memory devices, and may be linked together in fields of a record in a database across a network.

Suitable software to assist in implementing the invention is readily provided by those of skill in the pertinent art(s) using the teachings presented here and programming languages and tools, such as Java, Pascal, C++, C, database languages, APIs, SDKs, assembly, firmware, microcode, and/or other languages and tools.

Embodiments as disclosed herein may be computer-implemented in whole or in part on a digital computer. The digital computer includes a processor performing the required computations. The computer further includes a memory in electronic communication with the processor to store a computer operating system. The computer operating systems may include, but are not limited to, MS-DOS, Windows, Linux, Unix, AIX, CLIX, QNX, OS/2, and Apple. Alternatively, it is expected that future embodiments will be adapted to execute on other future operating systems.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Various operational steps, as well as components for carrying out operational steps, may be implemented in alternate ways depending upon the particular application or in consideration of any number of cost functions associated with the operation of the system, e.g., one or more of the steps may be deleted, modified, or combined with other steps.

While the principles of this disclosure have been shown in various embodiments, many modifications of structure, arrangements, proportions, the elements, materials and components, used in practice, which are particularly adapted for a specific environment and operating requirements, may be used without departing from the principles and scope of this disclosure. These and other changes or modifications are intended to be included within the scope of the present disclosure.

The scope of the present invention should, therefore, be determined only by the following claims.

The invention claimed is:

1. A controller of an electrical power system, the controller comprising:
    a data storage device configured to store a demand setpoint representing an upper limit demand of the electrical power system; and
    one or more processors operably coupled to the data storage device and configured to:
        compare an adjusted demand associated with the electrical power system to the demand setpoint;
        adjust the demand setpoint, wherein the demand setpoint adjustment occurs at a frequency higher than a billing frequency associated with the electrical power system, and wherein the demand setpoint adjustment is based at least on a function of historic load data and a power level of an alternate power system;
        obtain a configuration of the electrical power system, the configuration including one or more constraints of the electrical power system and one or more cost elements including equipment degradation costs;
        based on the configuration, determine a control plan for the electrical power system, the control plan including the adjusted demand setpoint and one or more control parameters for each time segment of a set upcoming time segments; and
        provide, according to the control plan, at least one control value to at least one of a load and a generator of the electrical power system to effectuate change to the electrical power system toward compliance with the demand setpoint during a time segment of the set of upcoming time segments, wherein the control value is based on the one or more control parameters for the time segment.

2. The controller of claim 1, wherein the historic load data comprises a historic load profile, one or more historic load observations, or a combination thereof, and wherein each of the one or more historic load observations comprises a record of received process variables indicative of electrical power system state measurements.

3. The controller of claim 2, further comprising a load predictor configured to predict a load on the electrical power system based at least in part on a load predictor algorithm.

4. The controller of claim 3, wherein the load predictor is further configured to utilize the historic load observations with the load predictor algorithm to predict the load on the electrical power system.

5. The controller of claim 1, wherein the alternate power system is an energy-limited power system, and wherein the alternate power system comprises a battery power system, a generator power system, or a combination thereof.

6. The controller of claim 1, wherein the one or more processors operably coupled to the data storage device are further configured to adjust the demand setpoint based at least on the function of historic load data, the power level of the alternate power system, a stored energy capacity of the alternate power system, or combinations thereof.

7. The controller of claim 1, wherein the one or more processors operably coupled to the data storage device are further configured to adjust the demand setpoint based at least on the function of historic load data, the power level of the alternate power system, a stored energy capacity of the alternate power system, a maximum charge rate, a maximum discharge rate, or combinations thereof.

8. The controller of claim 1, wherein the one or more processors operably coupled to the data storage device are further configured to, based at least on the comparison, increase the demand setpoint when the adjusted demand is greater than the demand setpoint.

9. The controller of claim 1, wherein the one or more processors operably coupled to the data storage device are further configured to, based at least on the comparison, decrease the demand setpoint when the adjusted demand is less than the demand setpoint.

10. The controller of claim 1, wherein the alternate power system is a power system other than the electrical power system.

11. The controller of claim 1, wherein the one or more processors operably coupled to the data storage device are further configured to:
    monitor the adjusted demand associated with the electrical power system.

12. A method comprising:
    storing a demand setpoint representing an upper limit demand threshold of an electrical power system;
    comparing an adjusted demand associated with the electrical power system to the demand setpoint; and adjusting the demand setpoint, wherein the demand setpoint adjustment occurs at a frequency higher than a billing frequency associated with the electrical power system, and wherein the demand setpoint adjustment is based at least on a function of historic load data and a power level of an alternate power system; and obtaining a configuration of the electrical power system, the configuration including one or more constraints of the electrical power system and one or more cost elements including equipment degradation costs;

based on the configuration, determine a control plan for the electrical power system, the control plan including the adjusted demand setpoint and one or more control parameters for each time segment of a set upcoming time segments; and providing, according to the control plan, at least one control value to at least one of a load and a generator of the electrical power system to effectuate change to the electrical power system to attempt to comply with the demand setpoint during a time segment of the set of upcoming time segments, wherein the control value is based on the one or more control parameters for the time segment.

13. The method of claim 12, wherein the historic load data comprises a historic load profile, one or more historic load observations, or a combination thereof, and wherein each of the one or more historic load observations comprises a record of received process variables indicative of electrical power system state measurements.

14. The method of claim 13, the method further comprising:
utilizing the historic load observations with the load predictor algorithm to predict the load on the electrical power system.

15. The method of claim 12, the method further comprising:
predicting a load on the electrical power system based at least in part on a load predictor algorithm.

16. The method of claim 12, wherein the alternate power system is an energy-limited power system, and wherein the alternate power system comprises a battery power system, a generator power system, or a combination thereof.

17. The method of claim 12, wherein adjusting the demand setpoint is further based at least on the function of historic load data, the power level of the alternate power system, a stored energy capacity of the alternate power system, or combinations thereof.

18. The method of claim 12, further comprising increasing the demand setpoint when the adjusted demand is greater than the demand setpoint.

19. The method of claim 12, further comprising decreasing the demand setpoint when the adjusted demand is less than the demand setpoint.

20. The method of claim 12, wherein the alternate power system is a power system other than the electrical power system.

* * * * *